(12) United States Patent
Avsian et al.

(10) Patent No.: US 8,551,815 B2
(45) Date of Patent: Oct. 8, 2013

(54) STACK PACKAGES USING RECONSTITUTED WAFERS

(75) Inventors: Osher Avsian, Huntersville, NC (US); Andrey Grinman, Jerusalem (IL); Giles Humpston, Buckinghamshire (GB); Moti Margalit, Zichron Yaaqov (IL)

(73) Assignee: Tessera, Inc., San Jose, CA (US)

( * ) Notice: Subject to any disclaimer, the term of this patent is extended or adjusted under 35 U.S.C. 154(b) by 92 days.

(21) Appl. No.: 12/671,993

(22) PCT Filed: Aug. 1, 2008

(86) PCT No.: PCT/US2008/009353
§ 371 (c)(1),
(2), (4) Date: Jul. 16, 2010

(87) PCT Pub. No.: WO2009/020572
PCT Pub. Date: Feb. 12, 2009

(65) Prior Publication Data
US 2011/0248410 A1   Oct. 13, 2011

Related U.S. Application Data

(60) Provisional application No. 60/963,209, filed on Aug. 3, 2007.

(51) Int. Cl.
*H01L 21/44* (2006.01)
*H01L 21/48* (2006.01)
*H01L 21/50* (2006.01)

(52) U.S. Cl.
USPC .......... 438/108; 438/109; 438/110; 438/111; 438/113

(58) Field of Classification Search
USPC ................. 257/685, 686, 723, 724, E23.022; 438/109, 110, 108, 111, 113
See application file for complete search history.

(56) References Cited

U.S. PATENT DOCUMENTS

| 4,074,342 A | 2/1978 | Honn et al. |
| 4,500,905 A | 2/1985 | Shibata |

(Continued)

FOREIGN PATENT DOCUMENTS

| CN | 1723556 A | 1/2006 |
| CN | 1913149 A | 2/2007 |

(Continued)

OTHER PUBLICATIONS

International Search Report and Written Opnion, PCT/US2007/021552 dated May 29, 2008.

(Continued)

*Primary Examiner* — Ngan Ngo
(74) *Attorney, Agent, or Firm* — Lerner, David, Littenberg, Krumholz & Mentlik, LLP

(57) ABSTRACT

A stacked microelectronic unit is provided which has a top surface and a bottom surface remote from the top surface and a plurality of vertically stacked microelectronic elements therein, including at least one microelectronic element having a front face adjacent to the top surface and a rear face oriented towards the bottom surface. Each of the microelectronic elements has traces extending from contacts at the front face beyond edges of the microelectronic element. A dielectric layer contacts edges of the microelectronic elements and underlies the rear face of the at least one microelectronic element. Leads are connected to the traces extending along the dielectric layer. Unit contacts, exposed at the top surface, are connected to the leads.

9 Claims, 13 Drawing Sheets

(56) References Cited

U.S. PATENT DOCUMENTS

| | | |
|---|---|---|
| 4,765,864 A | 8/1988 | Holland et al. |
| 4,842,699 A | 6/1989 | Hua et al. |
| 4,897,708 A | 1/1990 | Clements |
| 4,954,875 A | 9/1990 | Clements |
| 5,322,816 A | 6/1994 | Pinter |
| 5,343,071 A | 8/1994 | Kazior et al. |
| 5,412,539 A | 5/1995 | Elwell et al. |
| 5,424,245 A | 6/1995 | Gurtler et al. |
| 5,426,072 A | 6/1995 | Finnila |
| 5,466,634 A | 11/1995 | Beilstein, Jr. et al. |
| 5,563,084 A | 10/1996 | Ramm et al. |
| 5,571,754 A | 11/1996 | Bertin et al. |
| 5,604,673 A | 2/1997 | Washburn et al. |
| 5,608,264 A | 3/1997 | Gaul |
| 5,614,766 A | 3/1997 | Takasu et al. |
| 5,618,752 A | 4/1997 | Gaul |
| 5,646,067 A | 7/1997 | Gaul |
| 5,656,553 A | 8/1997 | Leas et al. |
| 5,661,087 A | 8/1997 | Pedersen et al. |
| 5,682,062 A | 10/1997 | Gaul |
| 5,716,759 A | 2/1998 | Badehi |
| 5,766,984 A | 6/1998 | Ramm et al. |
| 5,767,001 A | 6/1998 | Bertagnolli et al. |
| 5,804,004 A | 9/1998 | Tuckerman et al. |
| 5,814,889 A | 9/1998 | Gaul |
| 5,817,530 A | 10/1998 | Ball |
| 5,880,010 A | 3/1999 | Davidson |
| 5,915,167 A | 6/1999 | Leedy |
| 5,946,545 A | 8/1999 | Bertin et al. |
| 5,973,386 A | 10/1999 | Horikawa |
| 6,002,167 A | 12/1999 | Hatano et al. |
| 6,022,758 A | 2/2000 | Badehi |
| 6,031,274 A | 2/2000 | Muramatsu et al. |
| 6,040,235 A | 3/2000 | Badehi |
| 6,103,552 A | 8/2000 | Lin |
| 6,130,823 A | 10/2000 | Lauder et al. |
| 6,133,640 A | 10/2000 | Leedy |
| 6,177,707 B1 | 1/2001 | Dekker et al. |
| 6,177,721 B1 | 1/2001 | Suh et al. |
| 6,188,129 B1 | 2/2001 | Paik et al. |
| 6,204,562 B1 | 3/2001 | Ho et al. |
| 6,208,545 B1 | 3/2001 | Leedy |
| 6,228,686 B1 | 5/2001 | Smith et al. |
| 6,252,305 B1 | 6/2001 | Lin et al. |
| 6,261,865 B1 | 7/2001 | Akram |
| 6,277,669 B1 | 8/2001 | Kung et al. |
| 6,340,845 B1 | 1/2002 | Oda |
| 6,344,401 B1 | 2/2002 | Lam |
| 6,396,710 B1 | 5/2002 | Iwami et al. |
| 6,472,247 B1 | 10/2002 | Andoh et al. |
| 6,472,293 B1 | 10/2002 | Suga |
| 6,486,546 B2 | 11/2002 | Moden et al. |
| 6,492,201 B1 | 12/2002 | Haba |
| 6,498,381 B2 | 12/2002 | Halahan et al. |
| 6,498,387 B2 | 12/2002 | Yang |
| 6,548,391 B1 | 4/2003 | Ramm et al. |
| 6,551,857 B2 | 4/2003 | Leedy |
| 6,562,653 B1 | 5/2003 | Ma et al. |
| 6,563,224 B2 | 5/2003 | Leedy |
| 6,582,991 B1 | 6/2003 | Maeda et al. |
| 6,607,938 B2 | 8/2003 | Kwon et al. |
| 6,607,941 B2 | 8/2003 | Prabhu et al. |
| 6,608,377 B2 | 8/2003 | Chang et al. |
| 6,611,052 B2 | 8/2003 | Poo et al. |
| 6,621,155 B1 | 9/2003 | Perino et al. |
| 6,624,505 B2 | 9/2003 | Badehi |
| 6,632,706 B1 | 10/2003 | Leedy |
| 6,646,289 B1 | 11/2003 | Badehi |
| 6,656,827 B1 | 12/2003 | Tsao et al. |
| 6,693,358 B2 | 2/2004 | Yamada et al. |
| 6,717,254 B2 | 4/2004 | Siniaguine |
| 6,727,576 B2 | 4/2004 | Hedler et al. |
| 6,730,997 B2 | 5/2004 | Beyne et al. |
| 6,737,300 B2 | 5/2004 | Ding et al. |
| 6,743,660 B2 | 6/2004 | Lee et al. |
| 6,753,205 B2 | 6/2004 | Halahan |
| 6,753,208 B1 | 6/2004 | MacIntyre |
| 6,777,767 B2 | 8/2004 | Badehi |
| 6,784,023 B2 | 8/2004 | Ball |
| 6,806,559 B2 | 10/2004 | Gann et al. |
| 6,828,175 B2 | 12/2004 | Wood et al. |
| 6,844,241 B2 | 1/2005 | Halahan et al. |
| 6,844,619 B2 | 1/2005 | Tago |
| 6,864,172 B2 | 3/2005 | Noma et al. |
| 6,867,123 B2 | 3/2005 | Katagiri et al. |
| 6,870,249 B2 | 3/2005 | Egawa |
| 6,878,608 B2 | 4/2005 | Brofman et al. |
| 6,897,148 B2 | 5/2005 | Halahan et al. |
| 6,958,285 B2 | 10/2005 | Siniaguine |
| 6,972,480 B2 | 12/2005 | Zilber et al. |
| 6,972,483 B1 | 12/2005 | Song |
| 6,982,475 B1 | 1/2006 | MacIntyre |
| 6,984,545 B2 | 1/2006 | Grigg et al. |
| 6,984,885 B1 | 1/2006 | Harada et al. |
| 7,001,825 B2 | 2/2006 | Halahan et al. |
| 7,005,324 B2 | 2/2006 | Imai |
| 7,034,401 B2 | 4/2006 | Savastiouk et al. |
| 7,049,170 B2 | 5/2006 | Savastiouk et al. |
| 7,060,601 B2 | 6/2006 | Savastiouk et al. |
| 7,087,459 B2 | 8/2006 | Koh |
| 7,115,986 B2 | 10/2006 | Moon et al. |
| 7,138,295 B2 | 11/2006 | Leedy |
| 7,160,753 B2 | 1/2007 | Williams, Jr. |
| 7,186,586 B2 | 3/2007 | Savastiouk et al. |
| 7,192,796 B2 | 3/2007 | Zilber et al. |
| 7,193,239 B2 | 3/2007 | Leedy |
| 7,208,343 B2 | 4/2007 | Song et al. |
| 7,208,345 B2 | 4/2007 | Meyer et al. |
| 7,215,018 B2 | 5/2007 | Vindasius et al. |
| 7,241,641 B2 | 7/2007 | Savastiouk et al. |
| 7,241,675 B2 | 7/2007 | Savastiouk et al. |
| 7,285,865 B2 | 10/2007 | Kwon et al. |
| 7,312,521 B2 | 12/2007 | Noma et al. |
| 7,394,152 B2 | 7/2008 | Yu et al. |
| 7,408,249 B2 | 8/2008 | Badihi |
| 7,474,004 B2 | 1/2009 | Leedy |
| 7,495,316 B2 | 2/2009 | Kirby et al. |
| 7,498,661 B2 | 3/2009 | Matsuo |
| 7,504,732 B2 | 3/2009 | Leedy |
| 7,510,928 B2 | 3/2009 | Savastiouk et al. |
| 7,521,360 B2 | 4/2009 | Halahan et al. |
| 7,622,810 B2 | 11/2009 | Takao |
| 7,662,670 B2 | 2/2010 | Noma et al. |
| 7,662,710 B2 | 2/2010 | Shiv |
| 7,663,213 B2 | 2/2010 | Yu et al. |
| 7,705,466 B2 | 4/2010 | Leedy |
| 7,759,166 B2 | 7/2010 | Haba et al. |
| 7,829,438 B2 | 11/2010 | Haba et al. |
| 7,859,115 B2 | 12/2010 | Kim et al. |
| 7,884,459 B2 | 2/2011 | Yoshida et al. |
| 7,901,989 B2 | 3/2011 | Haba et al. |
| 7,944,015 B2 | 5/2011 | Kitagawa et al. |
| 7,952,195 B2 | 5/2011 | Haba |
| 7,973,416 B2 | 7/2011 | Chauhan |
| 8,022,527 B2 | 9/2011 | Haba et al. |
| 8,043,895 B2 | 10/2011 | Haba et al. |
| 8,076,788 B2 | 12/2011 | Haba et al. |
| 8,357,999 B2 | 1/2013 | Robinson et al. |
| 2001/0024839 A1 | 9/2001 | Lin |
| 2001/0048151 A1 | 12/2001 | Chun |
| 2002/0047199 A1 | 4/2002 | Ohuchi et al. |
| 2002/0074637 A1 | 6/2002 | McFarland |
| 2002/0109236 A1 | 8/2002 | Kim et al. |
| 2002/0113303 A1* | 8/2002 | Murayama ............ 257/686 |
| 2002/0127775 A1 | 9/2002 | Haba et al. |
| 2002/0132465 A1 | 9/2002 | Leedy |
| 2002/0171145 A1 | 11/2002 | Higuchi et al. |
| 2003/0006494 A1* | 1/2003 | Lee et al. ............. 257/686 |
| 2003/0060034 A1 | 3/2003 | Beyne et al. |
| 2003/0094683 A1 | 5/2003 | Poo et al. |
| 2003/0096454 A1 | 5/2003 | Poo et al. |
| 2003/0173608 A1 | 9/2003 | Leedy |
| 2003/0209772 A1 | 11/2003 | Prabhu |
| 2003/0233704 A1 | 12/2003 | Castellote |

(56) References Cited

U.S. PATENT DOCUMENTS

| | | |
|---|---|---|
| 2004/0014255 A1 | 1/2004 | Grigg et al. |
| 2004/0016942 A1 | 1/2004 | Miyazawa et al. |
| 2004/0070063 A1 | 4/2004 | Leedy |
| 2004/0082114 A1 | 4/2004 | Horng |
| 2004/0104454 A1 | 6/2004 | Takaoka et al. |
| 2004/0142509 A1 | 7/2004 | Imai |
| 2004/0155326 A1 | 8/2004 | Kanbayashi |
| 2004/0155354 A1 | 8/2004 | Hanaoka et al. |
| 2004/0169278 A1 | 9/2004 | Kinsman |
| 2004/0221451 A1 | 11/2004 | Chia et al. |
| 2004/0222508 A1 | 11/2004 | Aoyagi |
| 2004/0245614 A1 | 12/2004 | Jobetto |
| 2004/0251525 A1 | 12/2004 | Zilber et al. |
| 2005/0003649 A1 | 1/2005 | Takao |
| 2005/0012225 A1 | 1/2005 | Choi et al. |
| 2005/0046002 A1 | 3/2005 | Lee et al. |
| 2005/0051883 A1 | 3/2005 | Fukazawa |
| 2005/0056903 A1 | 3/2005 | Yamamoto et al. |
| 2005/0067680 A1 | 3/2005 | Boon et al. |
| 2005/0073035 A1 | 4/2005 | Moxham |
| 2005/0095835 A1 | 5/2005 | Humpston et al. |
| 2005/0104179 A1 | 5/2005 | Zilber et al. |
| 2005/0156330 A1 | 7/2005 | Harris |
| 2005/0260794 A1 | 11/2005 | Lo et al. |
| 2005/0263866 A1 | 12/2005 | Wan |
| 2005/0287783 A1 | 12/2005 | Kirby et al. |
| 2006/0006488 A1 | 1/2006 | Kanbe |
| 2006/0017161 A1 | 1/2006 | Chung et al. |
| 2006/0043556 A1 | 3/2006 | Su et al. |
| 2006/0043598 A1 | 3/2006 | Kirby et al. |
| 2006/0043601 A1 | 3/2006 | Pahl |
| 2006/0046348 A1 | 3/2006 | Kang |
| 2006/0046471 A1 | 3/2006 | Kirby et al. |
| 2006/0055050 A1 | 3/2006 | Numata et al. |
| 2006/0055061 A1 | 3/2006 | Hosokawa et al. |
| 2006/0068580 A1 | 3/2006 | Dotta |
| 2006/0076670 A1 | 4/2006 | Lim et al. |
| 2006/0079019 A1 | 4/2006 | Kim |
| 2006/0094165 A1 | 5/2006 | Hedler et al. |
| 2006/0115932 A1 | 6/2006 | Farnworth et al. |
| 2006/0121645 A1 | 6/2006 | Ball |
| 2006/0138626 A1 | 6/2006 | Liew et al. |
| 2006/0175697 A1* | 8/2006 | Kurosawa et al. ............ 257/686 |
| 2006/0220234 A1 | 10/2006 | Honer et al. |
| 2006/0220262 A1 | 10/2006 | Meyer et al. |
| 2006/0249829 A1* | 11/2006 | Katagiri et al. ............... 257/686 |
| 2006/0258044 A1 | 11/2006 | Meyer et al. |
| 2006/0292866 A1 | 12/2006 | Borwick et al. |
| 2007/0007556 A1 | 1/2007 | Shibayama |
| 2007/0035001 A1 | 2/2007 | Kuhmann et al. |
| 2007/0037379 A1 | 2/2007 | Enquist et al. |
| 2007/0045803 A1 | 3/2007 | Ye et al. |
| 2007/0045862 A1 | 3/2007 | Corisis et al. |
| 2007/0052050 A1 | 3/2007 | Dierickx |
| 2007/0102802 A1 | 5/2007 | Kang et al. |
| 2007/0126085 A1 | 6/2007 | Kawano et al. |
| 2007/0132082 A1 | 6/2007 | Tang et al. |
| 2007/0148941 A1 | 6/2007 | Haba et al. |
| 2007/0158807 A1 | 7/2007 | Lu et al. |
| 2007/0181989 A1 | 8/2007 | Corisis et al. |
| 2007/0190747 A1 | 8/2007 | Humpston et al. |
| 2007/0249095 A1 | 10/2007 | Song et al. |
| 2007/0257350 A1* | 11/2007 | Lee et al. ....................... 257/686 |
| 2008/0083976 A1* | 4/2008 | Haba et al. .................... 257/686 |
| 2008/0083977 A1* | 4/2008 | Haba et al. .................... 257/686 |
| 2008/0090333 A1 | 4/2008 | Haba et al. |
| 2008/0099900 A1 | 5/2008 | Oganesian et al. |
| 2008/0099907 A1 | 5/2008 | Oganesian et al. |
| 2008/0116544 A1 | 5/2008 | Grinman et al. |
| 2008/0116545 A1 | 5/2008 | Grinman et al. |
| 2008/0122113 A1 | 5/2008 | Corisis et al. |
| 2008/0157324 A1* | 7/2008 | Tang et al. .................... 257/686 |
| 2008/0157327 A1* | 7/2008 | Yang ............................. 257/686 |
| 2008/0166836 A1* | 7/2008 | Jobetto ......................... 438/109 |
| 2008/0246136 A1 | 10/2008 | Haba et al. |
| 2008/0284041 A1 | 11/2008 | Jang et al. |
| 2008/0308921 A1* | 12/2008 | Kim ............................... 257/686 |
| 2008/0315407 A1 | 12/2008 | Andrews, Jr. et al. |
| 2009/0009491 A1 | 1/2009 | Grivna |
| 2009/0032966 A1 | 2/2009 | Lee et al. |
| 2009/0039528 A1 | 2/2009 | Haba et al. |
| 2009/0065907 A1 | 3/2009 | Haba et al. |
| 2009/0067135 A1* | 3/2009 | Hirai ............................. 361/715 |
| 2009/0067210 A1 | 3/2009 | Leedy |
| 2009/0121323 A1 | 5/2009 | Kwon et al. |
| 2009/0160065 A1* | 6/2009 | Haba et al. .................... 257/777 |
| 2009/0166840 A1 | 7/2009 | Kang et al. |
| 2009/0166846 A1 | 7/2009 | Pratt et al. |
| 2009/0174082 A1 | 7/2009 | Leedy |
| 2009/0175104 A1 | 7/2009 | Leedy |
| 2009/0212381 A1 | 8/2009 | Crisp et al. |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2009/0309235 A1 | 12/2009 | Suthiwongsunthorn et al. |
| 2009/0316378 A1 | 12/2009 | Haba et al. |
| 2010/0053407 A1 | 3/2010 | Crisp et al. |
| 2010/0065949 A1 | 3/2010 | Thies et al. |
| 2010/0164086 A1* | 7/2010 | Noma et al. ................... 257/686 |
| 2010/0200966 A1* | 8/2010 | Karnezos ...................... 257/659 |
| 2010/0219523 A1* | 9/2010 | Chow et al. ................... 257/686 |
| 2010/0225006 A1 | 9/2010 | Haba et al. |
| 2010/0230795 A1 | 9/2010 | Kriman et al. |
| 2011/0006432 A1 | 1/2011 | Haba et al. |
| 2011/0024890 A1* | 2/2011 | Yang et al. .................... 257/686 |
| 2011/0039370 A1* | 2/2011 | Gomyo et al. ................ 438/109 |
| 2011/0198722 A1 | 8/2011 | Suh |
| 2011/0248410 A1 | 10/2011 | Avsian et al. |
| 2012/0025364 A1* | 2/2012 | Hoshino et al. ............... 257/686 |

FOREIGN PATENT DOCUMENTS

| | | |
|---|---|---|
| DE | 19516487 C1 | 7/1996 |
| DE | 102004039906 A1 | 8/2005 |
| EP | 0926723 A1 | 6/1999 |
| EP | 1041624 A1 | 10/2000 |
| EP | 1482553 A2 | 12/2004 |
| EP | 1519410 A1 | 3/2005 |
| EP | 1619722 A1 | 1/2006 |
| EP | 1653510 A2 | 5/2006 |
| EP | 1686627 A1 | 8/2006 |
| EP | 1 741 668 A2 | 1/2007 |
| EP | 1801866 A2 | 6/2007 |
| FR | 2704690 A1 | 11/1994 |
| FR | 2879347 A1 | 6/2006 |
| JP | 60160645 A | 8/1985 |
| JP | 07-509104 A | 10/1995 |
| JP | 08306724 A | 11/1996 |
| JP | 09045848 A | 2/1997 |
| JP | 2001015683 A | 1/2001 |
| JP | 2001035995 A | 2/2001 |
| JP | 2001-217386 A | 8/2001 |
| JP | 2001210782 A | 8/2001 |
| JP | 2002093944 A | 3/2002 |
| JP | 2003-037758 A | 2/2003 |
| JP | 2003163324 A | 6/2003 |
| JP | 2004063569 A | 2/2004 |
| JP | 2004119473 A | 4/2004 |
| JP | 2004153130 A | 5/2004 |
| JP | 2004158536 A | 6/2004 |
| JP | 2005101067 A | 4/2005 |
| JP | 2005303031 A | 10/2005 |
| JP | 2007523482 A | 8/2007 |
| KR | 100201672 B1 | 6/1999 |
| KR | 2006-0020822 A | 3/2006 |
| KR | 20070048952 A | 5/2007 |
| KR | 20090013417 A | 2/2009 |
| KR | 20090047776 A | 5/2009 |
| KR | 20090070420 A | 7/2009 |
| KR | 20090079924 A | 7/2009 |
| KR | 20100057025 A | 5/2010 |

(56) References Cited

FOREIGN PATENT DOCUMENTS

| TW | I289936 | | 4/2004 |
|---|---|---|---|
| WO | 9425987 | A1 | 11/1994 |
| WO | 9845130 | A1 | 10/1998 |
| WO | 9940624 | A1 | 8/1999 |
| WO | 2004/025727 | A1 | 3/2004 |
| WO | 2004114397 | | 12/2004 |
| WO | 2005081315 | A2 | 9/2005 |
| WO | 2006027981 | A1 | 3/2006 |
| WO | 20070066409 | A1 | 6/2007 |
| WO | 20090017758 | A2 | 2/2009 |
| WO | 20090017835 | A2 | 2/2009 |
| WO | 20090023462 | A1 | 2/2009 |

OTHER PUBLICATIONS

International Search Report and Written Opinion, PCT/US2008/009353 dated Feb. 10, 2009.
International Search Report and Written Opinion, PCT/US08/09207, dated Jan. 16, 2009.
Bang, U.S. Appl. No. 60/030,463, filed Sep. 6, 2002.
International Search Report, PCT/US2009/003643, dated Aug. 28, 2009.
Partial International Search Report, PCT/US2008/002659.
International Search Report, PCT/US2008/002659 dated Oct. 17, 2008.
International Search Report and Written Opinion, PCT/US2008/009356, dated Feb. 19, 2009.
International Search Report and Written Opinion, PCT/US2008/010746, date May 27, 2009.
Communication from PCT/US2010/000777, dated Aug. 5, 2010.
International Search Report, PCT/US07/26095, dated Jul. 7, 2008.
International Search Report from PCT/US2010/000777, dated Nov. 19, 2010.
Office Action from U.S. Appl. No. 12/908,227 mailed Apr. 9, 2012.
Response to Office Action from U.S. Appl. No. 12/908,227 mailed Mar. 20, 2012.
Office Action from U.S. Appl. No. 11/704,713 mailed Apr. 10, 2012.
Response to Office Action from U.S. Appl. No. 11/704,713 mailed Mar. 19, 2012.
Japanese Office Action for JP2011-554055 dated Mar. 27, 2012.
Chinese Office Action for Application No. 200880109094.9 dated Jun. 30, 2011.
Chinese Office Action and Search Report for Application 200980122523 dated Aug. 20, 2012.
Japanese Office Action for Application No. 2010-519235 dated Nov. 13, 2012.
Korean Office Action for Application No. 10-2011-7024111 dated Nov. 15, 2011.
Chinese Office Action for Application No. 200880110215.1 dated Apr. 19, 2013.

* cited by examiner

STACK PACKAGES USING RECONSTITUTED WAFERS

CROSS-REFERENCE TO RELATED APPLICATION

The present application is a national phase entry under 35 U.S.C. §371 of International Application No. PCT/US2008/009353 filed Aug. 1, 2008, designating the United States. Said international application claims the benefit of U.S. Provisional Application No. 60/963,209 filed Aug. 3, 2007, the disclosure of which is incorporated herein by reference.

BACKGROUND ART

The subject matter of the present application relates to microelectronic packages, or assemblies, comprised of stacked microelectronic elements and to methods of fabricating them, for example, by processing applied simultaneously to a plurality of microelectronic elements arranged in an array.

Microelectronic elements, such as semiconductor chips, are flat bodies with contacts disposed on the front surface that are connected to the internal electrical circuitry of the element itself. Microelectronic elements are typically packaged with substrates to form microelectronic packages, or assemblies, having terminals that are electrically connected to the element's contacts. The package or assembly may then be connected to test equipment to determine whether the packaged device conforms to a desired performance standard. Once tested, the package may be connected to a larger circuit, e.g., a circuit in an electronic product such as a computer or a cell phone.

Microelectronic packages or assemblies also include wafer level packages, which can be formed by wafer level processing applied simultaneously to a plurality of microelectronic elements, e.g., semiconductor die while the die are still attached together in form of a wafer or portion of a wafer. After subjecting the wafer to a number of process steps to form package structure thereon, the wafer and the package structure are then diced to free the individual die. Wafer level processing may provide a cost savings advantage. Furthermore, the package footprint can be identical to the die size, resulting in very efficient utilization of area on a printed circuit board (PCB) to which the die will eventually be attached. As a result of these features, die packaged in this manner are commonly referred to as wafer-level chip scale packages (WLCSP).

In order to save space certain conventional designs have stacked multiple microelectronic chips or elements within a package or assembly. This allows the package to occupy a surface area on a substrate that is less than the total surface area of all the chips in the stack added together. Development efforts in this technology focus on producing wafer-level assemblies that are reliable, or thin, or testable, or which are economical to manufacture, or have a combination of such characteristics.

SUMMARY OF THE INVENTION

In accordance with an aspect of the invention, a method is provided for fabricating a stacked microelectronic assembly. In accordance with such method, a first subassembly is formed which includes a plurality of spaced apart first microelectronic elements having front faces and contacts exposed at the front faces and rear faces remote from the front faces and edges extending between the front and rear faces. The first microelectronic elements can be joined to a carrier layer. A plurality of traces can extend from the contacts to beyond edges of the first microelectronic elements. A plurality of spaced apart second microelectronic elements can then be attached to the first subassembly, the second microelectronic elements having front faces and contacts exposed at the front faces, rear faces remote from the front faces, and edges extending between the front and rear faces. The rear faces of the second microelectronic elements can overlie and be adjacent to the front faces of respective ones of the first microelectronic elements. A plurality of traces can then be formed which extend from the contacts of the second microelectronic elements to beyond the edges of the second microelectronic elements. Leads may be formed in at least one opening extending between confronting edges of adjacent ones of the first microelectronic elements and between confronting edges of adjacent ones of the second microelectronic elements. The leads can be connected to the traces of the first and second microelectronic elements.

In accordance with an aspect of the invention, each of the first and second microelectronic elements can have a thickness of less than about 50 microns between the front face and the rear face. In one embodiment, at least one of the microelectronic elements includes a flash memory.

In accordance with an aspect of the invention, the stacked microelectronic assembly can be severed between edges of adjacent ones of the first and second microelectronic elements into a plurality of stacked microelectronic units, each unit including at least one first microelectronic element and at least one second microelectronic element.

In accordance with one aspect of the invention, the at least one opening can include channels which extend between the confronting edges of adjacent ones of the first and second microelectronic elements.

In accordance with one aspect of the invention, the at least one opening can include a plurality of spaced apart openings aligned with edges of the first and second microelectronic elements. The leads may extend within respective individual ones of the spaced apart openings, each lead being conductively connected with a single one of the traces.

In accordance with an aspect of the invention, a method is provided for fabricating a stacked microelectronic assembly. In accordance with such method, first and second subassemblies can be provided, each subassembly having a front surface and a rear surface remote from the front surface. Each subassembly can include a plurality of spaced apart microelectronic elements having front faces and contacts adjacent to the front surface, rear faces adjacent to the rear surface, and edges extending between the front and rear faces. A plurality of traces can be formed at the front surface of the first subassembly, the traces extending from the contacts of the first subassembly to beyond the edges of the microelectronic elements of the first subassembly. The first and second subassemblies can be joined such that the rear surface of the second subassembly confronts the front surface of the first subassembly. A plurality of traces can be formed at the front surface of the second subassembly. The traces may extend from the contacts of the second subassembly to beyond the edges of the microelectronic elements of the second subassembly. Leads can be formed in at least one opening extending between edges of adjacent microelectronic elements of the first and second subassemblies. The leads can be connected to the traces of the microelectronic elements of the first and second subassemblies.

In accordance with an aspect of the invention, each of the microelectronic elements of the first and second subassemblies has a thickness of less than about 50 microns between the front face and the rear face.

In accordance with an aspect of the invention, at least one of the microelectronic elements includes flash memory.

In accordance with an aspect of the invention, the stacked microelectronic assembly can be severed between edges of adjacent microelectronic elements into a plurality of stacked microelectronic units, each unit including microelectronic elements from each of the first and second subassemblies and leads connected to traces of the microelectronic elements.

In accordance with an aspect of the invention, the at least one opening can include channels extending between confronting edges of adjacent microelectronic elements.

In accordance with an aspect of the invention, the at least one opening includes a plurality of spaced apart openings aligned with edges of the microelectronic element. Leads of each stacked microelectronic unit may extend within respective individual ones of the spaced apart openings, each lead being conductively connected with a single one of the traces.

In accordance with an aspect of the invention, the front face of a given microelectronic element of the second subassembly can have at least one dimension different from a corresponding dimension of the front face of a microelectronic element of the first subassembly that the front face of the given microelectronic element overlies.

In accordance with an aspect of the invention, a front face of a given microelectronic element of the first subassembly can have at least one dimension different from a corresponding dimension of a front face of another microelectronic element of the first subassembly.

In accordance with an aspect of the invention, a front face of a given microelectronic element within the stacked assembly can have at least substantially the same dimensions as a front face of another microelectronic element that the given microelectronic element overlies within the stacked assembly.

In accordance with an aspect of the invention, each subassembly can further include alignment features adjacent to the front surface. The alignment features and the traces can be elements of the same metal layer exposed at the front surface.

In accordance with an aspect of the invention, the second subassembly can be joined to the first subassembly such that edges of microelectronic elements of the second subassembly are displaced in a lateral direction relative to edges of microelectronic elements of the first subassembly in vertical alignment therewith. The at least one opening can have a sloped wall exposing the traces adjacent to the laterally displaced edges of the vertically stacked microelectronic elements.

In accordance with such aspect of the invention, the lateral direction can be a first lateral direction and the edges of each microelectronic element can include first edges and second edges transverse to the first edges. In accordance with such aspect, the second subassembly can be joined to the first subassembly such that second edges of microelectronic elements of the second subassembly are further displaced in a second lateral direction relative to second edges of microelectronic elements of the first subassembly in vertical alignment therewith. The second lateral direction can be transverse to the first lateral direction. A second opening having a sloped wall can be formed which exposes second traces adjacent to the second edges. Leads can be formed which are connected to the second traces.

In accordance with an aspect of the invention, a stacked microelectronic unit can be provided which has a top surface and a bottom surface remote from the top surface and a plurality of vertically stacked microelectronic elements therein. At least one microelectronic element may have a front face adjacent to the top surface and a rear face oriented towards the bottom surface. Each of the microelectronic elements can have traces extending from contacts at the front face beyond edges of the microelectronic element. A dielectric layer may contact edges of the microelectronic elements and may underlie the rear face of the at least one microelectronic element. Leads can be connected to the traces extending along the dielectric layer. Unit contacts, exposed at the top surface, can be connected to the leads.

In accordance with such aspect of the invention, at least some bottom unit contacts can be exposed at the bottom surface, the bottom unit contacts being connected to the contacts of at least one of the microelectronic elements.

In accordance with an aspect of the invention, a stacked microelectronic unit can be provided which includes a first microelectronic element having a front face bounded by a first edge and a second edge remote from the first edge. A second microelectronic element can have a front face bounded by a first edge and a second edge remote from the first edge, and the first edge of the second microelectronic element can overlie the front face of the first microelectronic element, such that the first edge of the first microelectronic element extends beyond the first edge of the second microelectronic element. A dielectric layer may overlie the first edges of the first and second microelectronic elements. The dielectric layer may define an edge of the stacked unit. Leads can be connected to traces at the front faces of the first and second microelectronic elements. The leads can extend along the edge of the stacked unit.

In accordance with an aspect of the invention, the first and second microelectronic elements can include third edges oriented in a direction transverse to the first edges. The third edge of the second microelectronic element can overlie the front face of the first microelectronic element and the third edge of the first microelectronic element can extend beyond the third edge of the second microelectronic element. The dielectric layer may define a second edge of the stacked unit overlying the third edges of the microelectronic elements. The stacked unit may further include second leads extending along the second edge of the stacked unit.

In accordance with an aspect of the invention, a stacked microelectronic unit can be provided which includes a first microelectronic element having a front face bounded by a first edge and a second edge remote from the first edge. A second microelectronic element may have a front face bounded by a first edge and a second edge remote from the first edge. The front face of the second microelectronic element can overlie the front face of the first microelectronic element. The front faces of the first and second microelectronic elements may differ in at least one of length along the front faces in a longitudinal direction or in width along the front faces in a lateral direction transverse to the longitudinal direction. A dielectric layer can overlie the first edges of the first and second microelectronic elements. The dielectric layer may define an edge of the stacked unit. Leads can be connected to traces at front faces of the microelectronic elements and the leads may extend along the edge of the stacked unit.

DETAILED DESCRIPTION

Figure 1A:
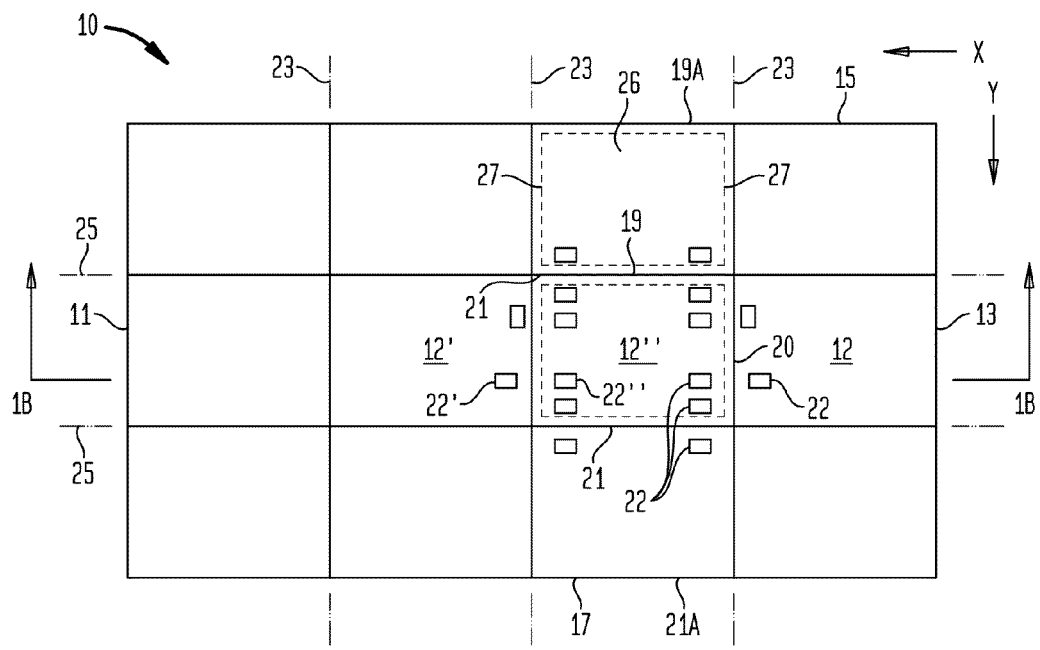
FIG. 1A is a plan view illustrating a wafer or portion of a wafer including a plurality of microelectronic elements attached together at edges.
Figure 1B:
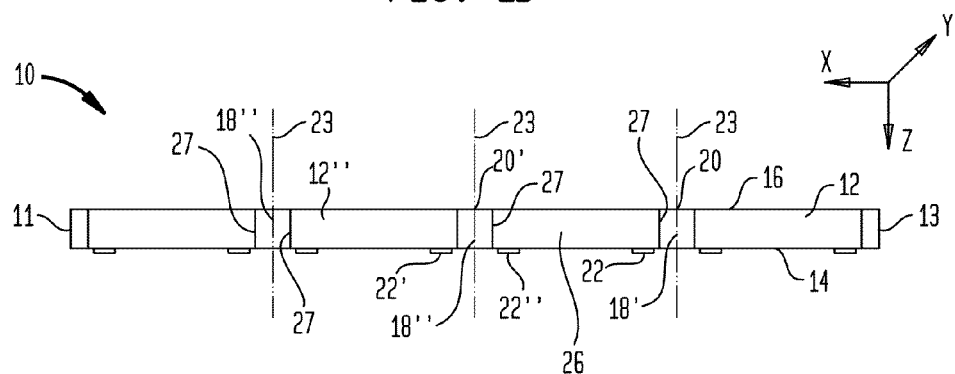
FIG. 1B is a corresponding sectional view through line 1B-1B of FIG. 1A.

FIGS. 1A-B illustrate an array, or a portion of an array of microelectronic elements, such as may be provided on a semiconductor wafer. FIG. 1A is a top plan view of a wafer 10 or portion of a wafer and includes a plurality of microelectronic elements 12, 12' (twelve prime), and 12" (twelve double prime), each microelectronic element being shown as a rectangle. As seen in FIG. 1A, each microelectronic element is positioned side by side and adjacent to one another. The wafer can be in the shape of a circular wafer. Hereinafter, for ease of reference, the wafer 10 or wafer portion is referred to as "wafer". The wafer 10 may include numerous rows of microelectronic elements 12 aligned along an X-axis and a Y-axis. The wafer may include any number of microelectronic elements, including as little as tow or as many as is desirable. The microelectronic elements are formed integral with one another using semiconductor fabrication techniques. Each of the microelectronic elements of the wafer is typically of the same type. The microelectronic elements can have memory function, logic or processor function or a combination of logic and processor functions, among other possible types. In a particular example, each of the microelectronic elements includes a flash memory. For example, each microelectronic element can be a dedicated flash memory chip.

Wafer 10 in FIG. 1A has a top edge 15, a right edge 13, a left edge 11 and a bottom edge 17. FIG. 1B is sectional view of wafer 10 taken along line 1B (FIG. 1A), showing left edge 11 and right edge 13 of wafer 10. FIG. 1C also shows that each microelectronic element of wafer 10 also has a front face 14 and an oppositely-facing rear face 16. Note that in FIG. 1C, the front face 14 of wafer 10 has been turned over such that it faces downward in the figure.

In FIG. 1A, three microelectronic elements 12, 12", and 12' are individually called out in the middle row of the wafer 10. With reference to microelectronic element 12 of FIG. 1A, each microelectronic element has a first edge 18, a second edge 20, a third edge 19 and a fourth edge 21. When microelectronic element 12 is still part of the array of wafer 10, a first edge 18 of one microelectronic element 12 abuts (or is attached to) second edge 20 of a second and adjacent microelectronic element 12. Similarly, a third edge 19 (FIG. 1A) of one microelectronic element 12 is attached to a fourth edge 21 of an adjacent microelectronic element. Thus, a microelectronic element 12" positioned in a middle row of the wafer portion 10 is bordered by an adjacent microelectronic element at all four edges, as shown in FIG. 1A. Each of first edge 18, second edge 20, third edge 19 and fourth edge 21 extends from the front face 14 to the rear face 16 of the microelectronic element 12, as illustrated in FIG. 1B.

Portions of wafer 10 where adjacent microelectronic elements contact one another form saw lanes or strips 23 and 25 where the wafer can be cut without damaging the individual microelectronic elements. For instance, as shown in FIG. 1B, second edge 20' of microelectronic element 12' abuts first edge 18' of microelectronic element 12" and forms a saw lane 23. Similarly, throughout the wafer 10, saw lanes 23 are located at positions where microelectronic elements 12 abut one another.

With reference to microelectronic element 12" of FIG. 1B, each microelectronic element includes a plurality of contacts 22, 22' or 22' exposed at the respective front face 14 of the microelectronic element 12. The contacts 22 can be, for example, bond pads or lands of the microelectronic elements as originally formed in a wafer fabrication facility. Each microelectronic element of the uncut wafer 10 has a device region 26 (area within dashed lines 27 (FIG. 1A) and within solid lines 27 (FIG. 1B)) in which active semiconductor devices and typically also passive devices are disposed. Each microelectronic element also includes a non-device region disposed beyond edges of the device region 26 where no active semiconductor devices or passive devices are disposed. Note that the bounded area of device region 26 is shown as the area between solid lines 27 in FIG. 1B.

In one stacked assembly fabrication embodiment, an assembly including a plurality of stacked microelectronic elements is fabricated by simultaneously processing a plurality of microelectronic elements en masse. Moreover, processing can be carried out simultaneously as to microelectronic elements which are arranged in form of an array, similar to the processing of an original wafer containing such microelectronic elements.

Figure 2A:
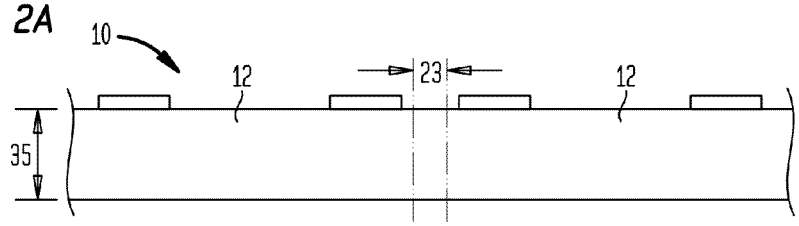
FIG. 2A is a sectional view of a wafer or portion of a wafer in a preliminary stage in a fabrication method in accordance with an embodiment of the invention.

FIGS. 2A-7 illustrate stages in a method of forming a package or assembly of stacked microelectronic elements in accordance with a first fabrication embodiment. FIG. 2A is a sectional view illustrating a wafer 10 or portion of a wafer, such wafer including a plurality of microelectronic elements 12 attached together at saw lanes, of which saw lanes 23 are shown in FIG. 2A. Typically, the wafer 10 or wafer portion includes an m×n array of chips (m, n each greater than one) as described above with respect to FIGS. 1A-B. The thickness 37 of the wafer 10 between the wafer's front face 14 and the rear face 16 remote therefrom (FIG. 2B) is reduced from an original thickness 35 (FIG. 2A), such as by a polishing, lapping or grinding process applied to the rear face 16.

Figure 2B:
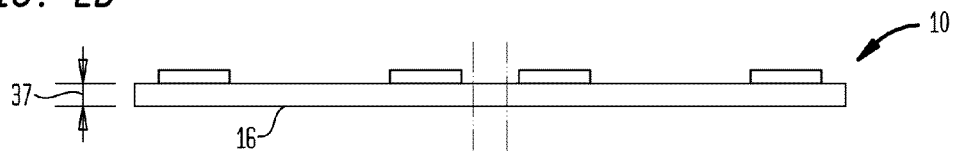
FIG. 2B is a sectional view of a wafer or portion of a wafer in a stage subsequent to the stage illustrated in FIG. 2A in a fabrication method according to an embodiment of the invention.
Figure 2C:
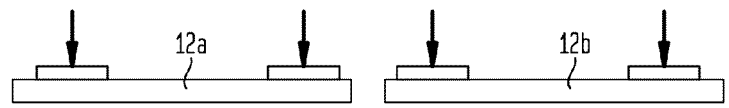
FIG. 2C is a sectional view illustrating a stage in a fabrication method according to an embodiment of the invention subsequent to the stage illustrated in FIG. 2B.

Referring to FIGS. 2B-C, after reducing the wafer thickness, the wafer then is separated into individual microelectronic elements 12 by severing, e.g., sawing or scribing wafer 10 along the dicing lanes 23 and 25 (FIG. 1A).

From the individual microelectronic elements obtained during this stage (FIG. 2B), selected ones 12 of the microelectronic elements, i.e., known good die, are attached at their front faces to an adhesive carrier 160 (FIG. 3) or other carrier having an adhesive interface (not shown). FIG. 2C represents determination of a known good die 12a and a rejected die 12b, the rejected die being removed from further processing.

Selected ones of the individual microelectronic elements then are attached in form of an array to a carrier layer 160 (FIG. 3) for further processing. The array of selected microelectronic elements form a "reconstituted wafer" which then is available for processing according to wafer-level processing techniques. A pick-and-place tool can be used, for example, to place each microelectronic element 12 at the proper position on the carrier 160 to form a layer of microelectronic elements which make up a first reconstituted wafer 130 as shown in sectional view in FIG. 3. As seen therein, the reconstituted wafer 110 includes individual microelectronic elements 12 that were selected from the microelectronic elements 12 obtained during the dicing (sawing) stage of FIG. 2B. Individual microelectronic elements 12 are referred to as the known good die, and are attached to the carrier 160, with the rear face of each die facing the carrier 160.

An advantage of processing a reconstituted wafer rather than the original wafer 10 is that the microelectronic elements that make up each reconstituted wafer can be individually selected. When some of the microelectronic elements of the original wafer are of known or suspected marginal or failing quality, they need not be processed into reconstituted wafers. Rather, those microelectronic elements can be left out of the reconstituted wafer such that the reconstituted wafer contains better quality microelectronic elements. Selection of the microelectronic elements to go into the reconstituted wafer can be based on various criteria of quality or expected quality. Microelectronic elements can be selected based of visual, mechanical or electrical inspection, for example. Alternatively, or in addition thereto, individual microelectronic elements can be selected based on the location of the microelectronic element within the original wafer 10, such as when the location of the microelectronic element on the wafer correlates to the quality of the microelectronic element. In a particular embodiment, microelectronic elements may in fact be tested electrically before placing each one into position on the reconstituted wafer. Whether the microelectronic elements are selected based on visual, mechanical or electrical criteria or other criteria, the microelectronic elements which are selected for inclusion in the reconstituted wafer can be referred to as "known good" microelectronic elements or "known good die".

Figure 3:
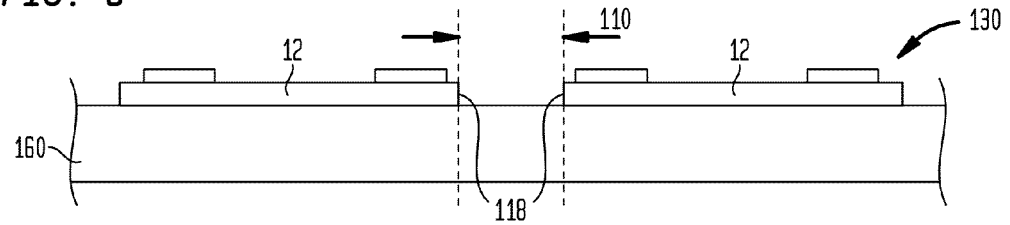
FIG. 3 is a sectional view illustrating a stage in a fabrication method according to an embodiment of the invention subsequent to the stage illustrated in FIG. 2C.

The microelectronic elements are attached to a carrier 160 as illustrated in FIG. 3 such that confronting edges 118 of adjacent microelectronic elements 12 are spaced apart by a spacing 110. The spacing between adjacent microelectronic elements can be selected in accordance with the requirements of the fabrication process. Therefore, spacings of several microns, tens of microns, or even one hundred microns or more may be utilized, depending upon the particular type of die and package to be made.

Figure 4B:
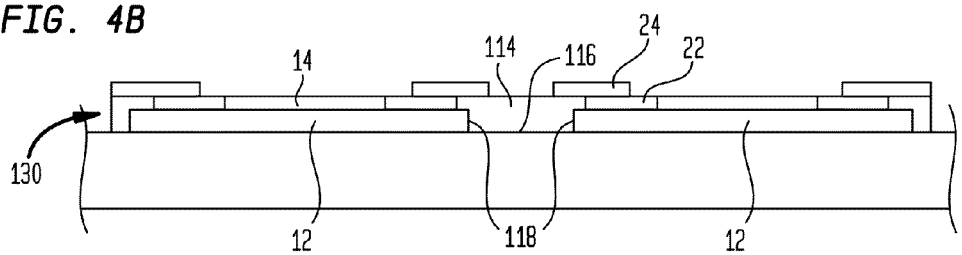
FIG. 4B is a corresponding sectional view through line 4B-4B of FIG. 4A.
Figure 4A:
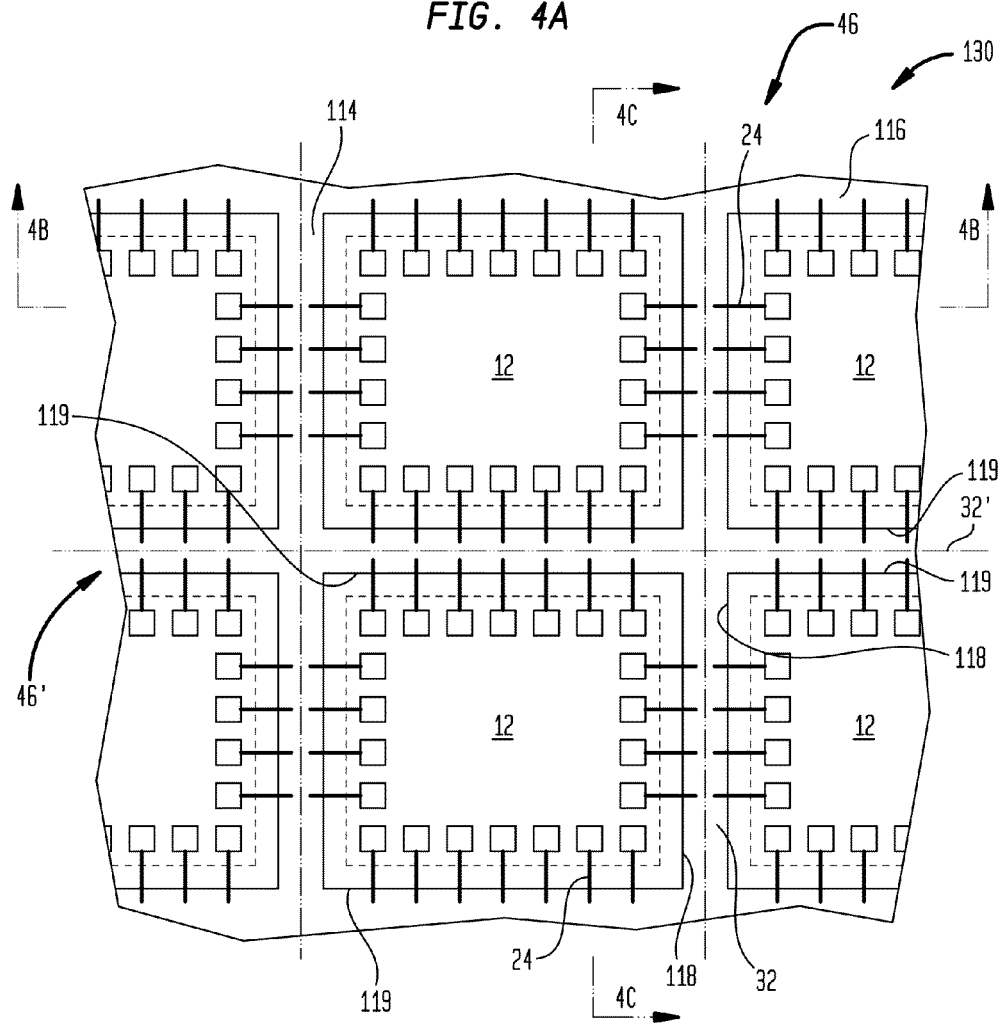
FIG. 4A is a fragmentary plan view illustrating a stage in a fabrication method according to an embodiment of the invention subsequent to the stage illustrated in FIG. 3.
Figure 4C:
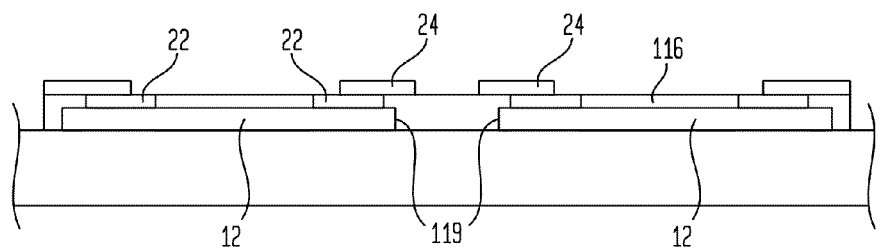
FIG. 4C is a corresponding sectional view through line 4C-4C of FIG. 4A.

After attaching the microelectronic elements 12 to the carrier 160, a fill layer 116 (FIG. 4A) is formed which fills spaces 114 of the reconstituted wafer 130 between adjacent microelectronic elements 12. The fill layer may also overlie the front faces 14 or portions of the front faces of the microelectronic elements 12, as seen in FIGS. 4B-C. The fill layer can include a variety of materials. The fill layer may include a dielectric material for providing isolation between the microelectronic elements and conductors which may be connected thereto, such as described in the following. For example, the fill layer may include one or more inorganic dielectric materials such as an oxide or a nitride, such as, for example, include silicon dioxide, silicon nitride or other dielectric compound of silicon such as SiCOH, among others. Alternatively, the fill layer may include an organic dielectric, among which are various polymers such as epoxies, polyimide, thermoplastics, thermoset plastics, among others, or the fill layer may include a combination of inorganic and organic dielectric materials. The fill layer 116 may be applied by a spin-on, roller coat, screening or stenciling process, among others. When the fill layer 116 overlies the front faces 14 of the microelectronic elements 12, its thickness can be reduced or unevenness (unplanarity) in the fill layer 116 can be reduced by a planarization process, if desired. A chemical or abrasive process or a process combining chemical and abrasive action such as chemical mechanical polishing can be used for this purpose.

Thereafter, traces 24 (FIGS. 4A-C) are formed which extend outwardly from each of the contacts 22 beyond at least some of the confronting edges 118 of the microelectronic elements and which may also extend beyond confronting edges 119 of individual microelectronic elements 12. If the fill layer 116 overlies the front faces 14, at least top faces of the contacts 22 on the microelectronic elements should be exposed prior to forming the traces 24. Traces 24 of adjacent microelectronic elements 12 may meet at a location between the edges 118, 119 of the adjacent microelectronic elements. Such traces 24 may actually form a single trace extending between adjacent contacts 22 of adjacent microelectronic elements 12. However, it is not required that the traces actually contact one another.

Figure 5:
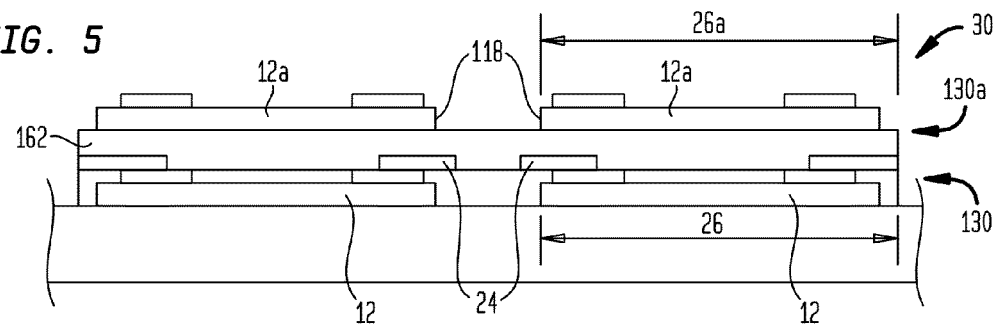
FIG. 5 is a sectional view illustrating a stage in a fabrication method according to an embodiment of the invention subsequent to the stage illustrated in FIGS. 4A-C.
Figure 6A:
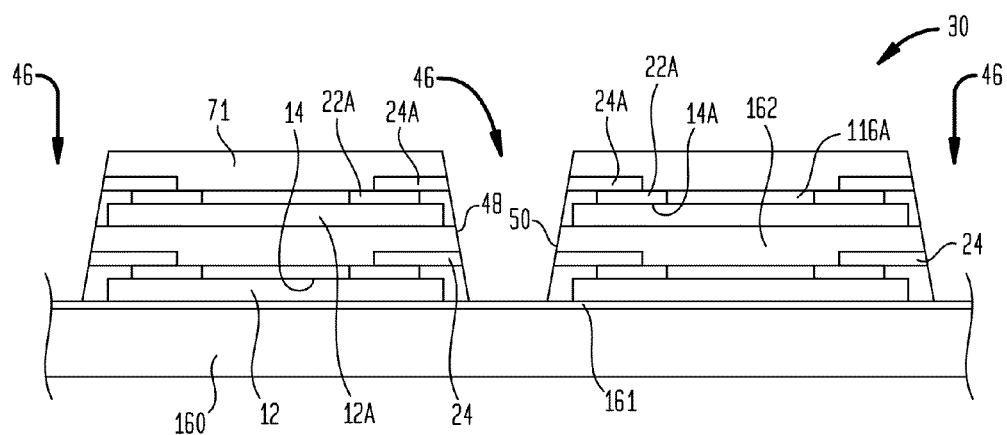
FIG. 6A is a sectional view illustrating a stage in a fabrication method according to an embodiment of the invention subsequent to the stage illustrated in FIG. 5.

Subsequently, as illustrated in FIG. 5, additional microelectronic elements 12A are attached to the initial microelectronic elements 12 with an adhesive layer 162 between them. In like manner as described above, the additional microelectronic elements 12A can be reduced in thickness and can be selected for quality before attaching them to the first reconstituted wafer 130. The adhesive layer 162 can include a die attach adhesive. Optionally, the adhesive layer can be selected for properties of compliancy, thermally conductivity, impermeability to moisture or other contaminant, or a combination of such properties. The adhesive layer 162 may be a flowable adhesive or tacky (partially cured) adhesive applied to overlie the front surfaces 14 of microelectronic elements, after which microelectronic elements 12A are attached to the adhesive layer, such as using a pick-and-place tool. Alternatively, the adhesive layer 162 may be deposited as a liquid onto a peelable backing or attached as a partially cured adhesive layer 162 to a peelable backing, after which microelectronic elements 12A then are attached to the adhesive layer. After removing the peelable backing, the adhesive layer 162 can then be aligned and joined with the microelectronic elements 12 and fill layer 116 of the reconstituted wafer 130. As illustrated in FIG. 5, the microelectronic elements 12A of the second level can have the same width 26A as the width 26 of the microelectronic elements 12 of the first level. Subsequently, as illustrated in FIG. 6A, a fill layer 116A is applied to fill spaces between confronting edges of adjacent microelectronic elements 12A to form a second reconstituted wafer 130A. The fill layer 116A may overlie portions of the front faces 14A of the microelectronic elements 12A, with the contacts 22A thereof exposed. Extension traces 24A are now formed which contact the contacts 22A exposed at the front surfaces 14A of the second layer of microelectronic elements 12A. Subsequently, a dielectric packaging layer 71 can be formed to overlie the traces 24A, thus forming a dielectric insulative layer overlying traces 24A of a stacked assembly 30 including reconstituted wafers 130, 130A.

Subsequently, a plurality of channels 46 are cut into the stacked assembly. The channels 46 can be formed using a mechanical cutting instrument not shown in the figures. Examples of such a mechanical cutting instrument can be found in U.S. Pat. Nos. 6,646,289 and 6,972,480, the disclosures of which are hereby incorporated by reference herein. Alternatively, a laser cutting technique can be used to form the channels.

Figure 6B:
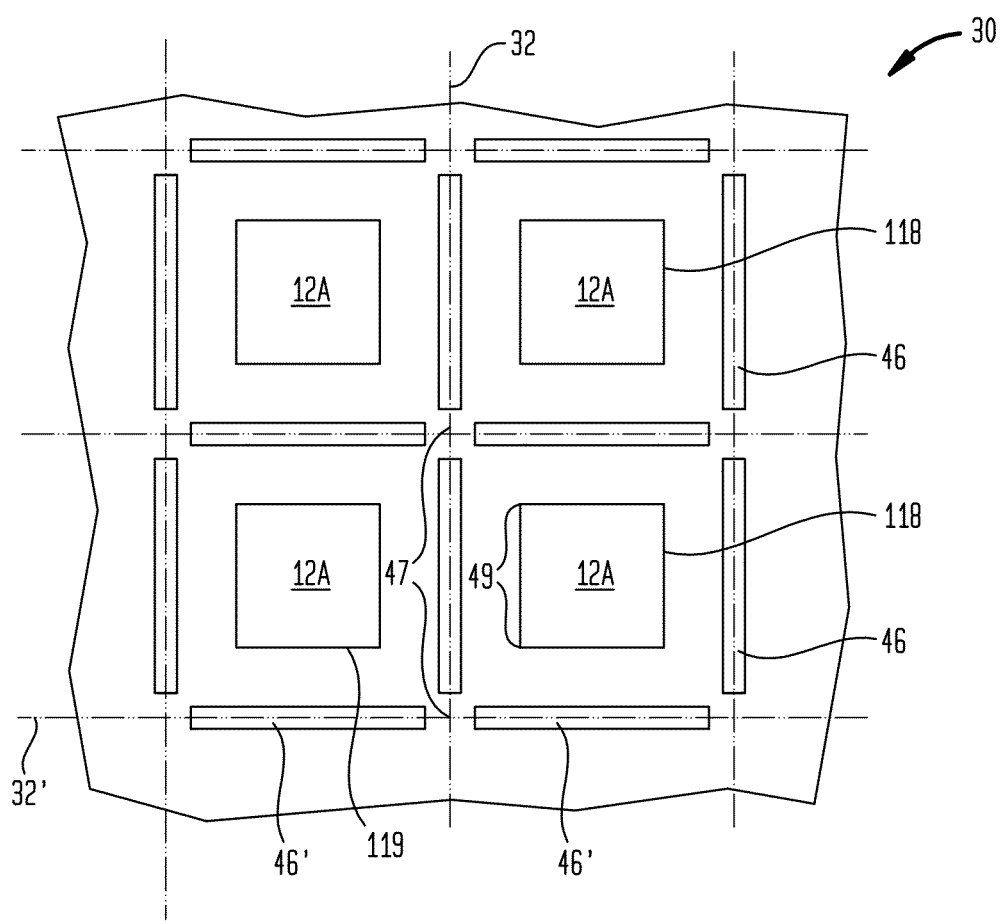
FIG. 6B is a fragmentary plan view of a wafer or portion of wafer corresponding to FIG. 6A.

As seen in FIG. 6B, the channels 46, 46' can be formed by mechanically cutting or laser-forming gaps aligned with the dicing lanes 32, 32' of the stacked assembly 30. Channels 46 extend between adjacent microelectronic elements 12A in an up-down layout direction (which can be referred to as north-south directions, although there is no requirement or expectation that such directions match the compass directions of true north and south). Channels 46 extend in a direction of north-south dicing lanes 32 of the stacked assembly. In addition, channels 46' extend between adjacent microelectronic elements 12A in a left-right layout direction (which can be referred to as west-east directions, although there is no requirement nor intention that such directions match the compass directions of true west and east). Channels 46' extend in a direction of west-east dicing lanes 32' of the stacked assembly.

As seen in FIG. 6B, each channel 46, 46' need not extend continuously along the respective dicing lanes 32, 32' of the stacked assembly. Rather, the channels can be interrupted by gaps 47 in directions aligned with the dicing lanes. The gaps are areas in which the channels are not cut into the stacked assembly. Within the gaps, the fill layer fills the space between the confronting edges of adjacent microelectronic elements. In the example shown in FIG. 6B, the gaps can occur near corners 49 of the microelectronic elements. Forming the channels with gaps along the length of the dicing lanes in this manner can provide for increased mechanical strength of the stacked assembly 30 during subsequent processing because the fill layer remains intact within the gaps.

Alternatively, in a variation of that shown in FIG. 6B, the gaps can be omitted such that the channels 46, 46' extend continuously along the lengths of the dicing lanes 32, 32'. IN such case, a single cut may be used to form a channel extending downwardly between adjacent microelectronic elements 12A and 12 of multiple levels of the stacked assembly. The channels 46 can be formed in alignment with dicing lanes 32 (FIG. 4A) which run between the confronting edges 118 of microelectronic elements and extend in a direction parallel to the edges 118. Similarly, channels 46' can be formed in alignment with dicing lanes 32' which run between the confronting edges 119 of microelectronic elements and extend in a direction parallel to the edges 119. The channels 46, 46' are formed with sufficient width such that traces 24A and 24 are exposed at walls 48, 50 (FIG. 6A) of the channels.

As further illustrated in FIG. 6, the channels may be formed such that they do not extend entirely through the stacked assembly 30. For example, as shown in FIG. 6A, the microelectronic elements 12 of the initial level remain attached to each other as the channels 46 do not extend through the carrier layer 160 to which they are attached. However, the channels 46 do extend far enough so as to expose the traces 24 of the microelectronic elements 12 of the initial level. Similarly, the channels 46 extend through adhesive layer 162 connecting the initial level of microelectronic elements 12 with the second level 12A. Optionally, the channels may extend through a lower adhesive layer 161 which connects microelectronic elements 12 to the carrier layer 160. Although the channels 46 are illustrated having inclined walls 48, 50, optionally, the walls may be straight, that is, parallel to each other and oriented in a normal direction to the plane defined by the front faces 14 of the microelectronic elements 12.

Once the various channels 46, 46' have been created in the stacked assembly 30, leads 66 (FIG. 7) may be formed on the walls of the channels 46 or walls of both the channels 46 and 46'. The leads 66 may be formed by any suitable metal deposition technique, for example, a process that includes sputtering or electroless plating, photolithography and electroplating. A three-dimensional photolithography process may be employed to define locations of the leads, such as is disclosed in commonly owned U.S. Pat. No. 5,716,759, the disclosure of which is hereby incorporated by reference herein. The leads 66 extend along walls of the channels 46, and electrically contact the traces 24, 24A of the microelectronic elements 12, 12A, respectively, at each level of the assembly 30.

Figure 7:
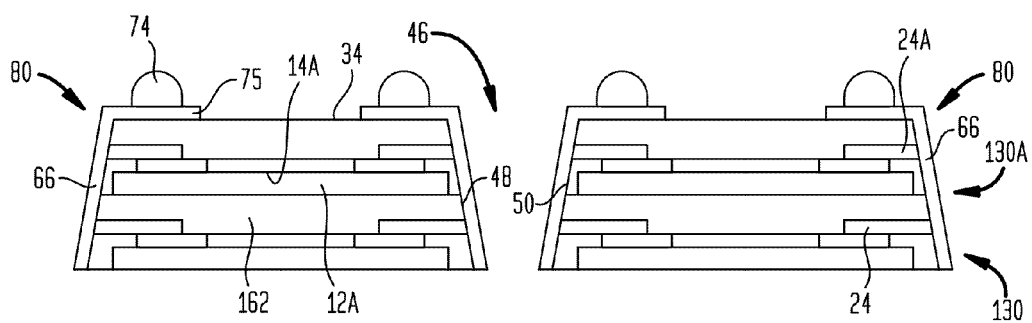
FIG. 7 is a sectional view illustrating stacked microelectronic units in accordance with an embodiment of the invention.

In the embodiment illustrated in FIG. 7, the leads 66 extend beyond the walls 48, 50 of channels 46 such that the leads extend along a top surface 34 of the stacked assembly adjacent to a front face 14A of microelectronic element 12A. A rear face 16A of that microelectronic element 12A is oriented towards a rear surface 36 of the stacked assembly. The leads 66 may include ends 75 or pads remote from channels 46 on which solder bumps 74 may be disposed. Each lead 66 can electrically connect with both a trace 24 of a microelectronic element 12 and a trace 24A of microelectronic element 12A, as a result of those traces 24, 24A being exposed and aligned along one line extending up and down a given wall, e.g. wall 48 of the channel 46. Alternatively, each lead 66 can electrically connect with only one of the traces 24, 24A exposed at a wall 48 of the channel, e.g., wall 48. Such result may be obtained by positioning the traces 24, 24A in different planes which occur at different positions into and out of the sheet relative to the particular section which is illustrated in FIG. 7. For example, the plane in which trace 24 is found as illustrated in FIG. 7 may be offset from the plane in which trace 24A is found such that trace 24 is closer to the viewer of FIG. 7 when viewed in three dimensions. Lead 66, which is aligned and connected with trace 24, is also offset from trace 24A and not in contact with trace 24A. So although in a two-dimensional view, the traces 24, 24A may appear to be attached to lead 66 in FIG. 7, only one may be actually attached to the lead.

As shown in FIG. 7, after the channels 46 and various conductive elements including leads 66 are formed in the stacked assembly 30, individual packages 80 may be severed from the stacked assembly by separating the carrier layer 160 from the stacked assembly and cutting or breaking any material remaining between adjacent microelectronic elements, such as in gaps 47 (FIG. 6B) of the stacked assembly. In this way, a plurality of stacked individual packages or units 80 result, with each stacked individual unit 80 containing a plurality of microelectronic elements stacked one upon another. As shown in FIG. 7, each unit 80 has two vertically stacked microelectronic elements 12, 12A therein, the microelectronic elements being joined together through adhesive layer 162. Greater or fewer numbers of vertically stacked microelectronic elements can be included in the package. The package is capable of being externally interconnected to other elements by ends 75 of leads overlying the top surface 34 of the unit.

In a variation of the above-described embodiment, the adhesive layer 162A between microelectronic elements 12, 12A of adjacent reconstituted wafers need not be continuous. Instead, openings can be provided in such adhesive layer before attaching the microelectronic elements 12A thereto. Since the traces 24 of the microelectronic elements 12 of the first reconstituted wafer extend beyond edges 118, 119 of the microelectronic elements 12, traces 24 can be accessible from above through the openings in the adhesive layer 162. In one embodiment, the adhesive layer can include a partially cured, tacky adhesive having openings in axial alignment with the spaces between confronting edges 118 of the microelectronic elements 12A. The openings may be pre-punched prior to attaching the microelectronic elements 12A thereto. Alternatively, the openings may be formed after the adhesive layer 162 is attached to microelectronic elements 12 or after the adhesive layer 162 is attached to microelectronic elements 12A but before the adhesive layer with the microelectronic elements 12A thereon are attached to the initial layer of microelectronic elements 12.

Figure 8:
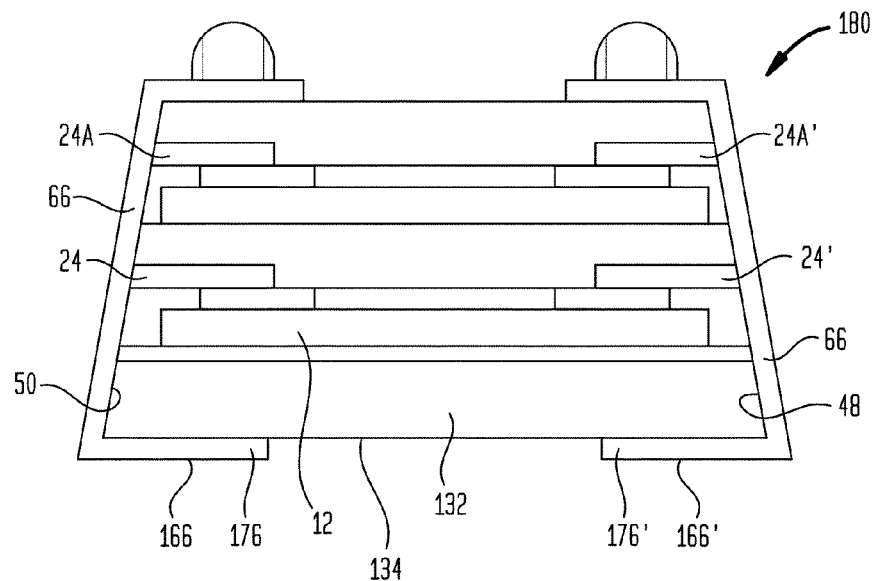
FIG. 8 is a sectional view illustrating a stacked microelectronic unit in accordance with a variation of the embodiment of the invention illustrated in FIG. 7.

In one variation of the above-described embodiment, a stacked assembly 180 (FIG. 8) includes a bottom packaging layer 132, the bottom packaging layer of which may include a portion of the carrier layer 160 (FIG. 6A). Thus, the bottom packaging layer 132 can be severed from the carrier layer 160 during the cutting operation used to form the channels 46, 46' (FIGS. 6A-6B). An adhesive layer 161 such as described above may join the microelectronic element 12 with the bottom packaging layer 132. In addition, the unit shown in FIG. 8 is capable of being externally interconnected by bottom unit contacts 176 exposed at the bottom surface 134 of the unit. Bottom unit contacts 176, 176' can be formed integrally with leads 166, 166', respectively, which connect with leads 66 at edges 48, 50 of the unit. Leads 166, 166' can be formed by processes similar to those described with reference to FIG. 7 above for the formation of leads 66. For example, leads 166 can be formed through use of one or more photolithography steps performed either before performing one or more photolithography steps needed to form leads 166, 166' or subsequent thereto. Alternatively, the carrier layer 160 (FIG. 6A) can include leads 166, 166' pre-formed thereon, such that when the leads 66 shown in FIG. 8 are formed, conductive connections are made between the leads 66 and leads 166, 166'.

As in the above-described embodiment, each bottom unit contact 176, 176' may be connected to only one trace 24, 24', respectively, of one microelectronic element. Alternatively, each bottom unit contact 176 may be connected to two traces 24, 24A which are aligned together within the plane in the section illustrated in FIG. 8. Similarly, each bottom unit contact 176' may be connected to two traces 24', 24A' which are aligned together. The units illustrated in FIGS. 7 and 8 show microelectronic elements stacked only two high in the vertical direction (the direction extending normal to the front surfaces of the microelectronic elements). However, each unit can include a greater number of vertically stacked microelectronic elements such that the microelectronic elements can be vertically stacked three high, four high or a greater number.

Figure 9A:
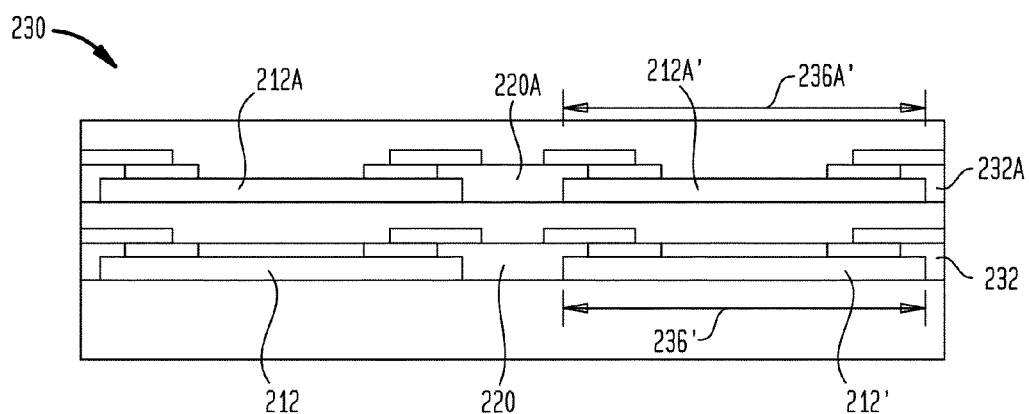
FIG. 9A is a sectional view a illustrating a stage in a fabrication method according to a variation of the embodiment of the invention illustrated in FIG. 7.
Figure 9B:
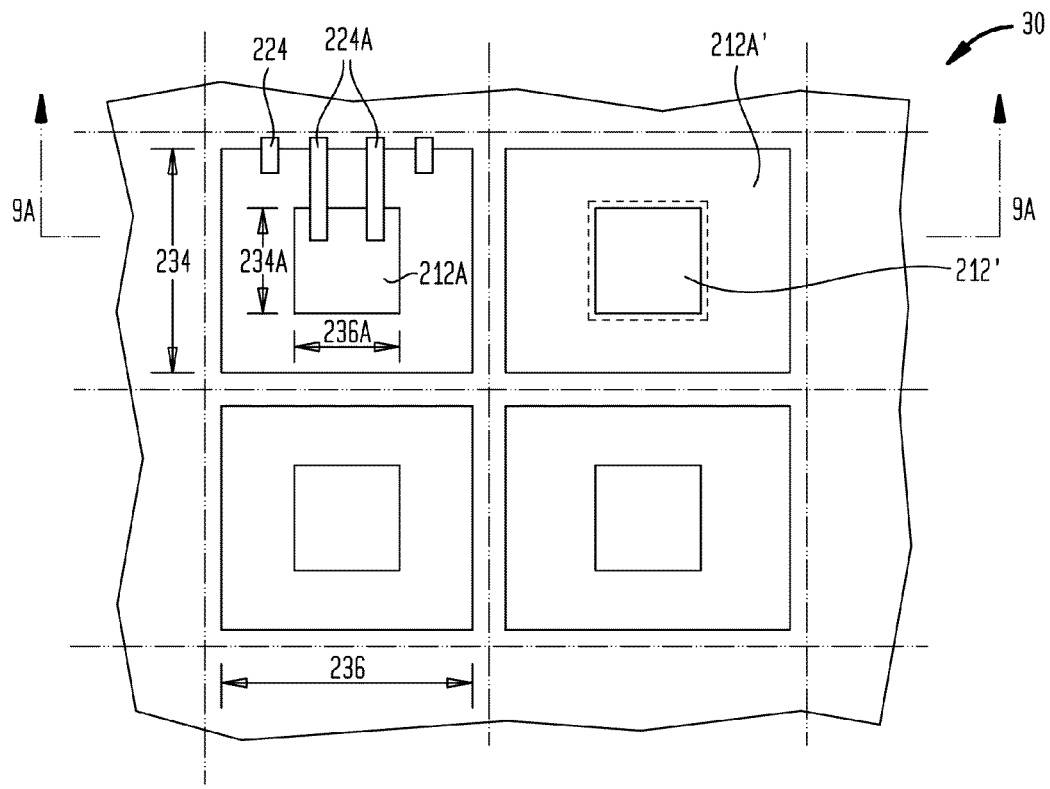
FIG. 9B is a fragmentary partial plan view corresponding to the sectional view of FIG. 9A.

In a variation (FIG. 9A) of the above-described process of forming stacked packages, microelectronic elements of differing sizes are joined together within a stacked assembly 230. FIG. 9A illustrates a stage of fabrication prior to that in which channels 46 (FIGS. 6A-B) are formed. FIG. 9B is a fragmentary plan view corresponding thereto, looking towards front faces of microelectronic elements 212A, 212A'. As illustrated in FIGS. 9A-B, some of the microelectronic elements 212A which make up a second level 232A of the stacked assembly 230 may have greater or smaller dimensions than microelectronic elements 212, 212' of a lower level or initial level 232 therein. In one example, microelectronic element 212' of the initial level 232 can have smaller dimensions than a microelectronic element 212A' of the second level. In another example, microelectronic element 212 of the initial level 232 can have larger dimensions than microelectronic element 212A.

Figure 10:
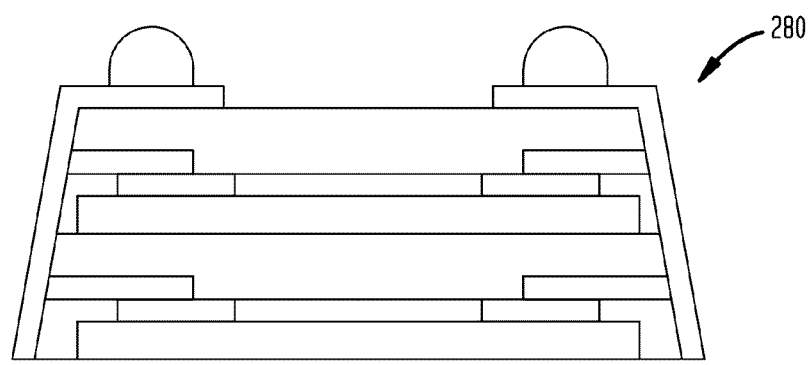
FIG. 10 is a sectional view illustrating a stacked microelectronic unit in accordance with a variation of the embodiment of the invention illustrated in FIG. 7.

Thus, as seen in plan in FIG. 9B, both the length 234A and width 236A of the front face of the upper microelectronic element 212A are smaller than the length 234 and width 236 of the front face of the lower microelectronic element 212 to which the upper microelectronic element 212A is vertically aligned. In another example illustrated in FIG. 9A, the width 236A' of the microelectronic element 212A' is greater than the width 236' of microelectronic element 212' of the lower level. The versatility of the techniques described herein is exemplified by the structure shown in FIGS. 9A-B. Specifically, traces 224 and 224A of each level can be of different lengths, since the process of forming fill layers 220, 220A between edges of microelectronic elements leaves a surface on which traces of different lengths can be formed by subsequent processing, as described above with reference to FIG. 4. Many variations can be made whereby, for example, microelectronic elements of an upper layer have larger size than those of the lower layer. In yet another example, smaller dimensioned microelectronic elements can be vertically sandwiched between larger dimensioned chips, or larger dimensioned chips can be vertically sandwiched between smaller dimensioned chips. FIG. 10 illustrates a stacked microelectronic unit 280, formed by further processing the stacked assembly in a manner as described above with respect to FIGS. 6A-B and 7.

Figure 11:
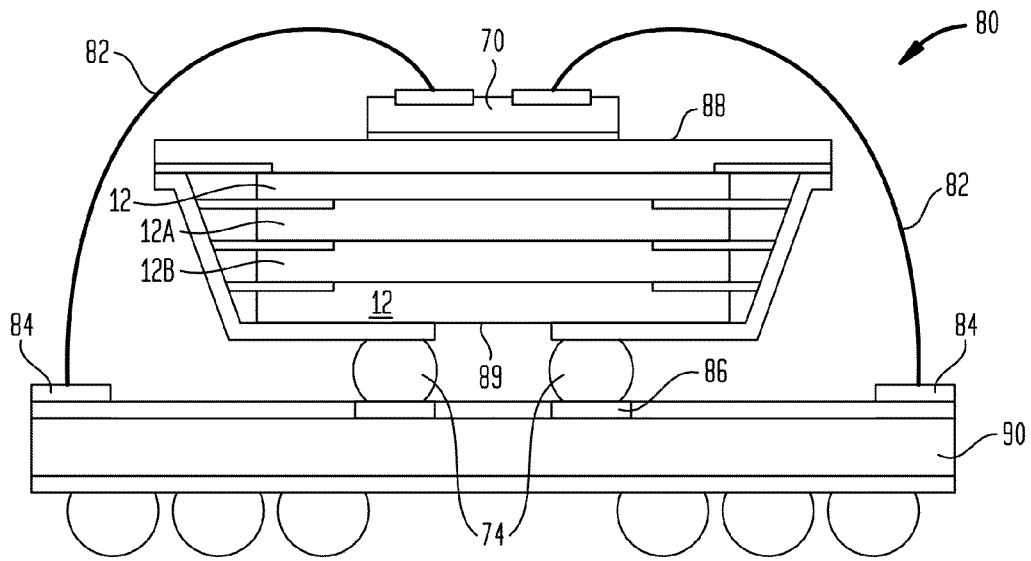
FIG. 11 is a sectional view illustrating a stacked microelectronic unit as attached to external elements in accordance with an embodiment of the invention.

An individual stacked microelectronic unit 80 or package (FIG. 11) can be electrically connected via solder bumps 74 at the front face 89 of the package 80 to an interconnection element 90, e.g., a dielectric element, substrate, circuit panel or other element having terminals 84, 86 and conductive wiring therein. One or more additional microelectronic elements 70 can be attached to a rear face 88 of the package 80 and electrically interconnected by bond wires 82 to the terminals 84 of the interconnection element. Such microelectronic element 70 can include one or more additional microelectronic elements that supplement the function of the stacked package 80, e.g., such as a microcontroller, or can include one or more redundancy elements for substitution with one or more microelectronic elements 12, 12A, 12B, etc. of the assembly in case of a problem with such microelectronic element. In a particular embodiment, the individual stacked assembly or unit 80 may be incorporated into microprocessors, and RF units among other assemblies. One or more stacked units 80 may incorporate particular types of microelectronic elements such as flash memory or dynamic random access memory (DRAM) units and be incorporated in various units including memory modules, memory cards, and the like. Other exemplary arrangements for mounting and interconnecting the stacked unit 80 to an interconnection element are shown and described in commonly owned U.S. patent application Ser. No. 11/787,209 filed Apr. 13, 2007, the disclosure of which is hereby incorporated herein by reference. For example, the stacked unit 80 can be mounted with the front face facing either downwardly towards the interconnection element or upwardly away therefrom. In addition, the one or more additional microelectronic elements can be mounted either face-up as shown in FIG. 11 or face-down, such that the contact-bearing face is flip-chip mounted to the stacked unit 80. Various combinations and configurations and possible, such as illustrated in incorporated U.S. patent application Ser. No. 11/787,209.

Figure 12:
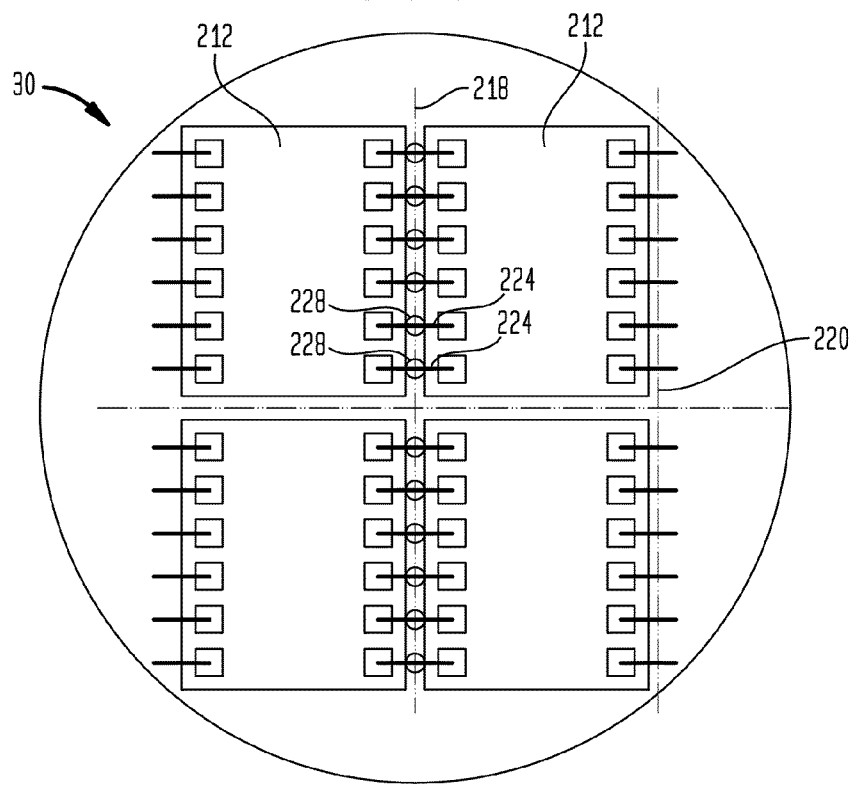
FIG. 12 is fragmentary partial plan view illustrating a stacked microelectronic unit in accordance with a variation of the embodiment of the invention illustrated in FIG. 7.

FIG. 12 is a fragmentary partial plan view showing a variation of the above embodiment, wherein, after forming the stacked assembly 30 (FIG. 5), the step of forming channels which expose all of the traces 24, 24A of the stacked microelectronic elements 12, 12A is omitted. Instead, a series of individual openings 228 are formed between the edges of respective microelectronic elements in alignment with the streets 218, 220. Unlike the channels 46, 46' (FIGS. 6A-B) formed according to the above-described embodiment, each of the openings 228 exposes no more than a single trace 224 of each respective microelectronic element. As shown in FIG. 12, traces 224 connected to contacts of two adjacent microelectronic elements 212 are exposed within one of the openings 228 between two adjacent microelectronic elements. In the stacked assembly 30 as shown in FIG. 12, a plurality of traces 224 connected to microelectronic elements of the same subassembly can be exposed within a single opening 228. Alternatively or in addition thereto, a plurality of traces 224 can be connected to the microelectronic elements of respective reconstituted wafers 130, 130A (FIG. 7) at first and second levels of the stacked assembly. However, openings 228 can be formed such that no more than one trace of each individual microelectronic element is exposed within each opening 228.

To form leads and external unit contacts connected to individual ones of the traces 224 all openings 228 in the stacked assembly can be simultaneously filled with a conductive material to form conductive vias connected to single traces of each microelectronic element. For example, the openings can be filled with a metal to form conductive vias by depositing a primary metal, e.g., by sputtering or electroless deposition, and then electroplating the resulting structure. Some of the metal deposited by the electroplating step may form a layer overlying the packaging layer 71 (FIG. 6A) above the front faces 14A of the microelectronic elements 12A. Such metal layer can be removed from overlying the front faces of the microelectronic elements, leaving surfaces of individual conductive vias exposed within each opening 228. Alternatively, the metal layer overlying the front faces of the microelectronic elements 212A can be patterned by photolithography into individual leads extending from the vias onto locations overlying the front faces of microelectronic elements 212A, similar to the leads 66 overlying the packaging layer 34 above the front faces 34 of microelectronic elements 12A in FIG. 7. Conductive bumps, e.g., solder bumps are balls, may then be formed at ends of the leads, as shown and described above with reference to FIG. 7.

In a particular embodiment, the process of forming the leads can be additive; the leads can be formed by printing the metal composite through a screen or stencil onto the stacked assembly. For example, a metal composite can be deposited through a stencil or by screen-printing to fill the openings 228 in the stacked assembly and form the leads 66. Subsequently, the stacked assembly can be heated to cure the metal composite. The openings can be filled at the same time by the same deposition process as that which forms the leads or the openings can be filled at a different time or different process than that which forms the leads. The metal composite can include, for example, a metal-filled paste such as an epoxy-solder composition, silver-filled paste, or other flowable composition having a dielectric, e.g., polymeric component loaded with metal particles.

Figure 13:
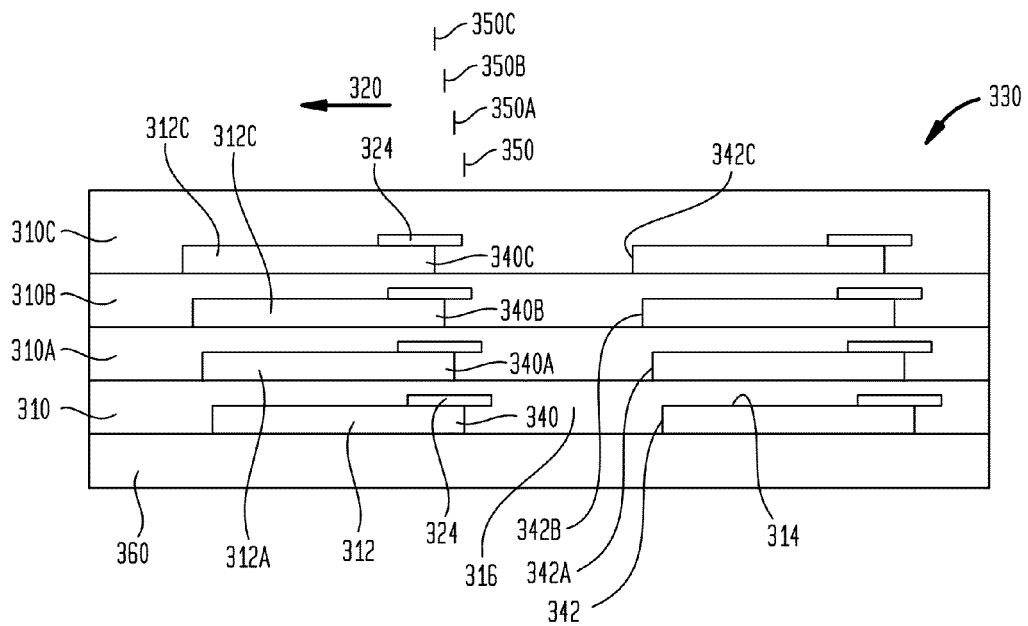
FIG. 13 is a sectional view illustrating a stage in a fabrication method in accordance with a variation of the embodiment of the invention illustrated in FIGS. 2A-7.
Figure 14:
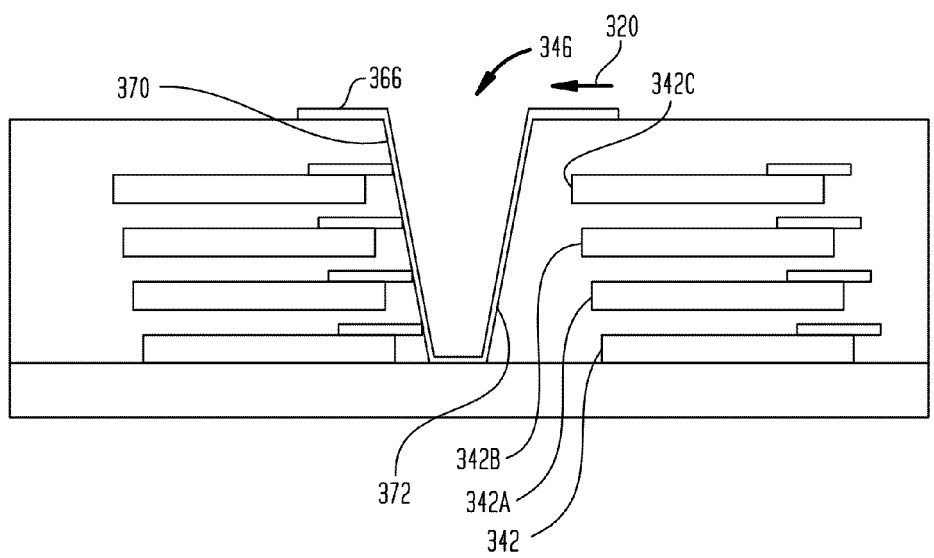
FIG. 14 is a sectional view illustrating a stage in a fabrication method according to an embodiment of the invention subsequent to the stage illustrated in FIG. 13.

In a variation of the embodiment described above (FIGS. 2-7), FIGS. 13 and 14 illustrate a method of forming stacked microelectronic units. Referring to FIG. 13, an array of microelectronic elements 312 at a first level are bonded to a carrier layer 360 and processed to form a fill layer 316 and traces 324 so as to form a reconstituted wafer 310 at a first level, and such that an edge 340 of a microelectronic element therein occurs at a lateral position 350. Subsequently, an array of microelectronic elements 312A are bonded to the reconstituted wafer 310 and processed to form a corresponding fill layer and traces 32A so as to form a second reconstituted wafer 310A at a second level. An edge 340A of a corresponding overlying microelectronic element of the second reconstituted wafer 310A occurs at a different position 350A which is offset in a lateral direction 320 from the edge 340 of the first wafer 310. Thus, for the microelectronic element 312A of the second reconstituted wafer having an area overlapping an area of the microelectronic element 312 to which it is bonded, the edge 340A of the microelectronic element 312A is displaced in the lateral direction 310 from the edge 340 of the underlying microelectronic element 312. An exemplary distance of the lateral offset between edges of vertically adjacent overlapping microelectronic elements can range from a few microns to tens of microns or more. These steps are repeated to attach microelectronic elements 312B to form a third reconstituted wafer 310B having edges offset from the edges of underlying microelectronic elements 312A and to form a fourth reconstituted wafer 3100 containing microelectronic elements 312C to form the stacked assembly 330 shown in FIG. 13.

An advantage of forming the stacked assembly in this manner is that process tolerances can improve for forming leads 366 (FIG. 14) adjacent to exposed edges 340, 340A, 340B and 340C. The lateral displacement of each succeeding overlapping microelectronic element in the stacked assembly allows for slope in the walls 370, 372 of the channel 346 formed therein. Lateral displacement of the edge (e.g., edge 340A) of each microelectronic element with respect to the edge (e.g., edge 340) of each microelectronic element immediately below it allows the walls 370, 372 of the channel 346 to be more heavily sloped, i.e., at a greater angle from the vertical. Here, "vertical" is defined as a normal angle to the plane defined by the contact-bearing surface 314 of a microelectronic element, e.g., element 312. With the slope in wall 370, the process of forming channels, e.g., by cutting or laser drilling (FIGS. 6A-B) exposes traces 324 at edges 340, even when the length of such traces 324 is limited.

It is apparent that edges 342, 342A, 342B, 342C of microelectronic elements which are adjacent to wall 372 of the channel 346 are also laterally offset. Again, these edges are displaced in direction 320 from each adjacent microelectronic element immediately below it. However, in this case, edges 342 are displaced in a direction which is opposite from the direction in which the wall 372 is sloped. Accordingly, there are no traces connected to leads at such edges 342.

Figure 15:
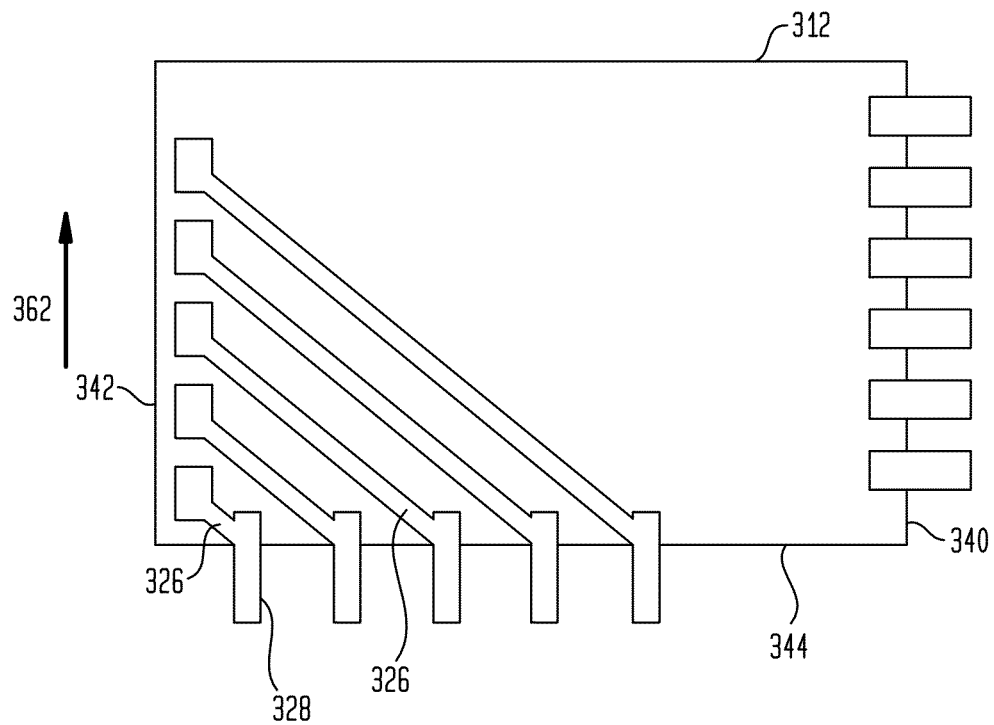
FIG. 15 is a plan view illustrating a microelectronic element in a fabrication method in accordance with a variation of the embodiment of the invention illustrated in FIGS. 13-14.
Figure 16:
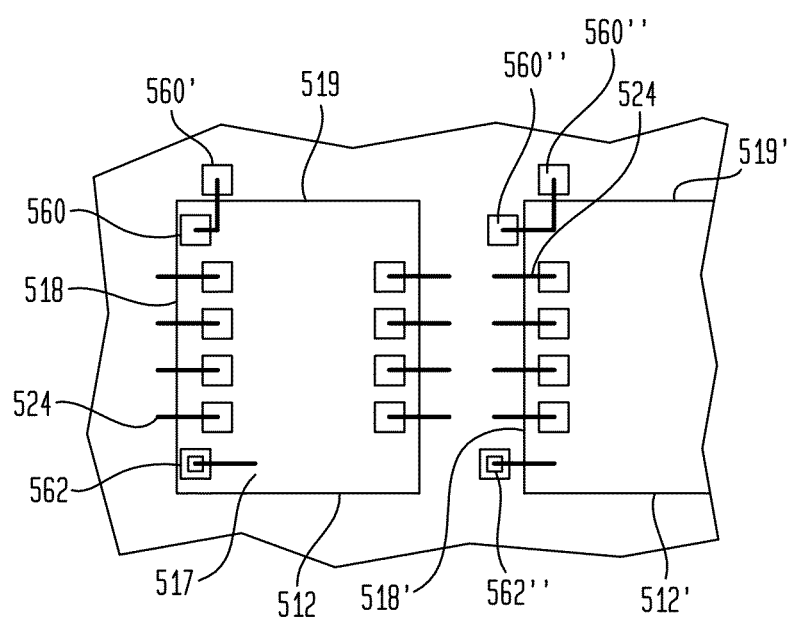
FIG. 16 is a plan view illustrating microelectronic elements in a fabrication method in accordance with an embodiment of the invention.

FIG. 16 is a plan view illustrating a microelectronic element 312 of one reconstituted wafer 310 of a stacked assembly in a variation of the above-described embodiment (FIG. 15). When the microelectronic elements 312 are provided with contact pads adjacent to edges 340 and 342 as illustrated in FIG. 15, a redistribution layer including additional traces 326 can be provided which extends between the pads at edge 342 and outwardly beyond a third edge 344 of the microelectronic element 312. When forming the stacked assembly 330 (FIG. 13), overlapping microelectronic elements of each successively stacked wafer 310 can be offset as well in a direction 362. In this way, leads can be formed in channels which expose traces 328 along the third edges 344 of the overlapping microelectronic elements, and process tolerance can also be improved for forming such leads.

In a particular variation of the above-described embodiments, alignment features 560, 562 (FIG. 16) can be formed on the front face 517 of each microelectronic element 512 at a stage of fabrication when the outwardly extending traces 524 are formed. The alignment features can be formed of metal simultaneously with the traces 524 by the same processing which forms the traces, such processing illustrated and described above with respect to FIGS. 4A-C. Alternatively, the alignment features can be formed by different processing from that which forms the traces. Stated another way, the alignment features can be formed using all the same processing steps as used to form the traces or by performing at least one processing step different from the processing steps used to form the redistribution traces.

When the alignment features are formed by different processing, they may include a material which is not included in the traces 524. Likewise, traces 524 may include a material, e.g., a metal which is not included in the alignment features. Optionally, the alignment features may be formed to include a material which is particularly reflective of a wavelength of a source, e.g., an infrared source used to illuminate the alignment features.

The alignment features may include two or more types of features, e.g., closed features 560 and open features 562 to permit edges of each microelectronic element 512 to be distinguished and to facilitate alignment of each microelectronic subassembly within two dimensions. The alignment features 560, 562 may be aligned with the area of each underlying microelectronic element 512 such that the alignment features do not extend beyond the edges of each microelectronic element 512. Alternatively, some or all alignment features, e.g., feature 560' may be only partially aligned with the area of the microelectronic element 512, such that the alignment feature extends beyond an edge of the microelectronic element 512. In another variation, as shown with respect to microelectronic element 512', alignment features 560" and 562" are disposed at locations which lie beyond the edges 518', 519' of the microelectronic element 512'. Such alignment features 560", 562" may be aligned entirely or partially with the area that the later formed channels 46 (FIGS. 6A-B) will occupy. In this way, alignment features can be provided while at the same time permitting a compact layout to be achieved in the microelectronic elements.

The alignment features 560, 562 at the front face 517 of an initial level 130 (FIG. 5) of a stacked assembly may be illuminated and detected by instruments disposed above that level 130 and assembling elements thereto to form the next level of microelectronic elements 130A (FIG. 5) such as described above with reference to FIG. 7. Alternatively or in addition thereto, the alignment features 560, 562 at the front face 517 of the first microelectronic subassembly 130 and of the second microelectronic assembly 130A may be illuminated and detected by instruments disposed below the carrier layer 160 (FIG. 5). In such case, the carrier layer 160 should have optical transmission characteristics that permit sufficient illumination by light passing through the thickness of the carrier layer 160.

FIGS. 17 through 20 are partial sectional views illustrating stages in a process of forming a reconstituted wafer 630 (FIG. 20), which can be defined as a subassembly including a single layer of semiconductor die or microelectronic elements arranged in an array. Such reconstituted wafer 630, representing a subassembly, can be utilized to make a stacked assembly including a plurality of subassemblies. The reconstituted wafer 630 has structure similar to that of a level 130 of the stacked assembly as shown and described above with respect to FIGS. 4-5. The reconstituted wafer 630 can be stacked and joined together with additional reconstituted wafers 630 to form a stacked assembly 30 (FIG. 6A) and further processed into a stacked microelectronic unit 80 as shown in FIG. 7.

Figure 17:
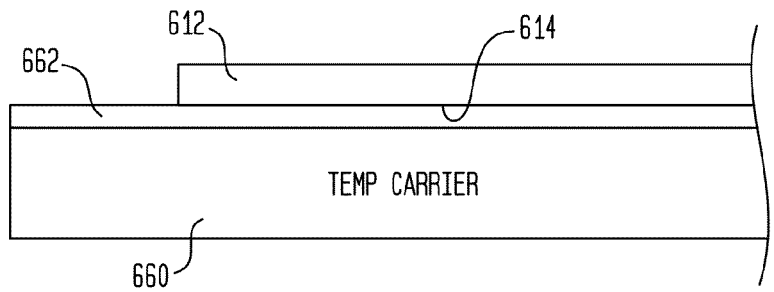
FIGS. 17 through 26 are sectional views illustrating successive stages in a fabrication method in accordance with an embodiment of the invention.

FIG. 17 illustrates a stage of fabrication in which a microelectronic element 612, e.g., a "known good die" is joined with its front face 614 oriented in a downward direction to a temporary carrier layer 660 with a dielectric layer 662 filling a space between the front face 614 and the carrier layer 660. As in the above-described embodiment, a plurality of microelectronic elements arranged in an array are placed and joined in this manner to the carrier layer 660. The dielectric layer can include or consist essentially of an adhesive or other dielectric joining material such as described above with reference to FIGS. 3 through 5, e.g., a passivation fill, which can have an organic component, inorganic component, or both. In one example, the dielectric layer includes a passivation layer 662 adjacent to the front face of the die, the passivation layer being removably attached to the carrier layer via a temporary adhesive.

Figure 18:
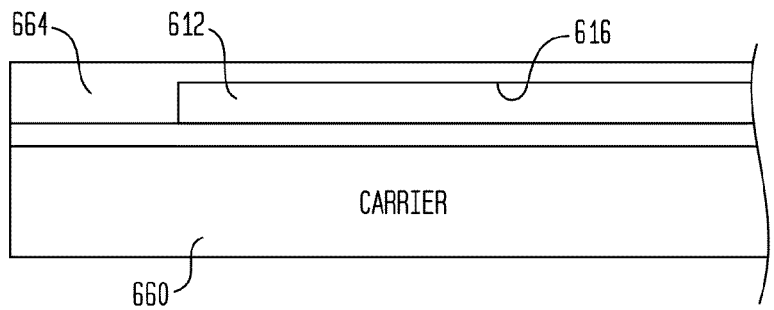

Subsequently, as illustrated in FIG. 18, a dielectric fill material 664 is deposited to fill gaps between the die 612 and other die, which are not shown but are attached to the carrier layer 660 and arranged with the die 612 in form of an array. The dielectric fill 664 can include the same dielectric material or other material as that of the layer 662. The dielectric fill 664 may coat the rear surfaces 616 of the dies or may only abut or partially cover the rear surfaces. The dielectric fill may be applied as a flowable self-planarizing material such as a spin-on dielectric composition or may be roller-coated or screened or stenciled into place using an appropriate applicator, among many possible examples. The dielectric material may then be cured by baking or other appropriate post-deposition treatment.

Figure 19:
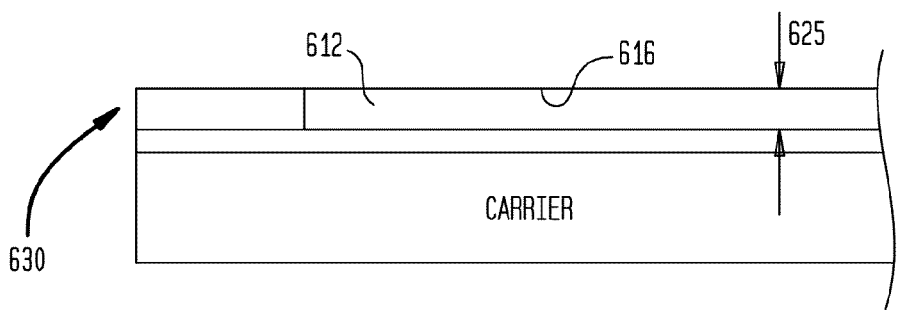

Subsequently, as illustrated in FIG. 19, the die of the resulting reconstituted wafer 630 can be can be subjected to polishing, grinding or lapping from the rear surface 616 until the thickness 625 reaches a desired value. The thickness of the die typically is measured as the distance between front and rear surfaces 614, 616. The carrier layer 660 provides mechanical support and rigidity to protect the die of the reconstituted wafer from shear stresses which could lead to warping, twisting, cracking or breaking. The dielectric fill layer 664 also helps preserve the structural integrity of the die during the grinding process. A final die thickness which can be very small, such as a few microns, e.g., 5 microns, can be achieved in this way. Of course, the thickness of the die can be reduced to greater values, as required for a particular type of die or package. Thus, the die thickness can be reduced to a value of 15 microns or below, or alternatively, may be reduced to a few tens of microns.

Figure 20:
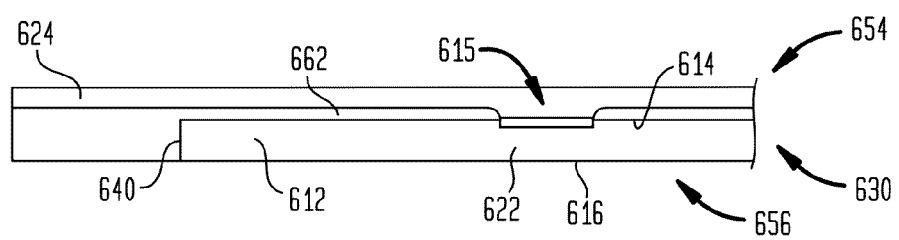

Referring to FIG. 20, after reducing the thickness, the reconstituted wafer 630 including the dielectric fill layer 664, the die 612 and the passivation layer 662 thereon can be detached from the carrier layer 660 to free the reconstituted wafer 630 from the carrier layer. In contrast to that shown in FIG. 19, in the view shown in FIG. 20, the die 612 of the reconstituted wafer 630 has the front face 614 oriented in an upward direction. Subsequently, openings 615 are made in the passivation layer 662 in alignment conductive pads 622, e.g., bond pads of the die, thus exposing conductive surfaces of the bond pads. Conductive traces 624 can then be formed in contact with the exposed bond pads 622, each trace 624 extending over the dielectric layer 662 outwardly beyond an edge 640 of each die 612. Thus, traces 624 extend along a surface of a dielectric layer 662 at a front surface 654 of a reconstituted wafer 630. A rear face 616 of a microelectronic element 612 can be exposed at a rear surface 656 of the reconstituted wafer.

Figure 21:
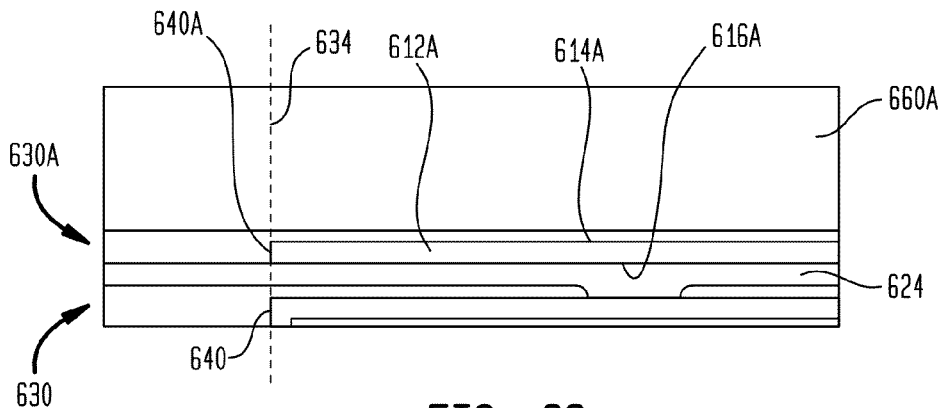
Figure 22:
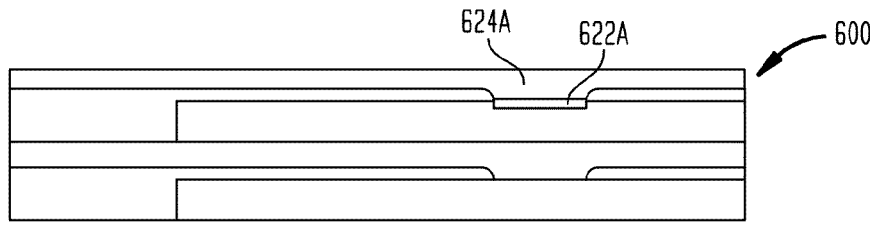

In the stage of processing illustrated in FIG. 21, a second reconstituted wafer 630A, fabricated in accordance with the method illustrated in FIGS. 17-19, is shown with the rear face 616A of a die 612A therein facing down and away from the carrier layer 660A. As illustrated in FIG. 21, the front face 614A of the die 612A remains attached to a carrier layer 660A used in fabricating the second reconstituted wafer 630A. Another reconstituted wafer 630 can then be attached to the second reconstituted wafer 630A such that the traces 624 of the reconstituted wafer 630 are adjacent to rear faces 616A of the microelectronic elements 612A in the second reconstituted wafer 630A. As shown in FIG. 21, edges 640, 640A of the microelectronic elements 612, 612A of the respective reconstituted wafers 630, 630A can be aligned along a vertical line 634 normal to the front face 616A. Subsequently, the carrier layer 660A is detached from the second reconstituted wafer 630A, and second layer traces 624A connected to pads 622A of die 612A are formed by the above-described process (FIG. 20), resulting in the stacked assembly 600 illustrated in FIG. 22.

Figure 23:
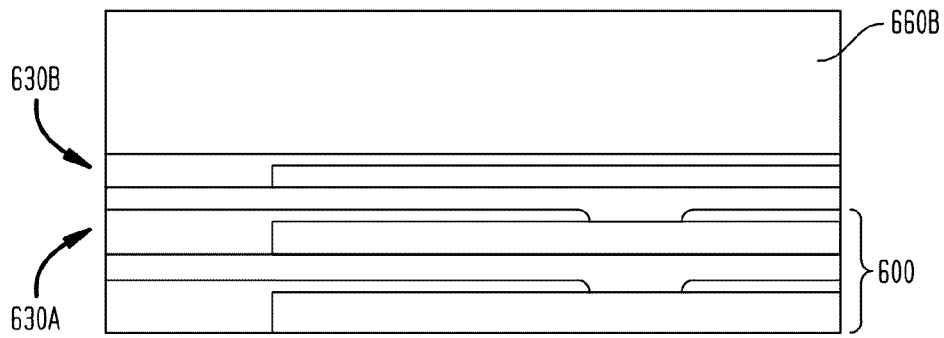
Figure 24:
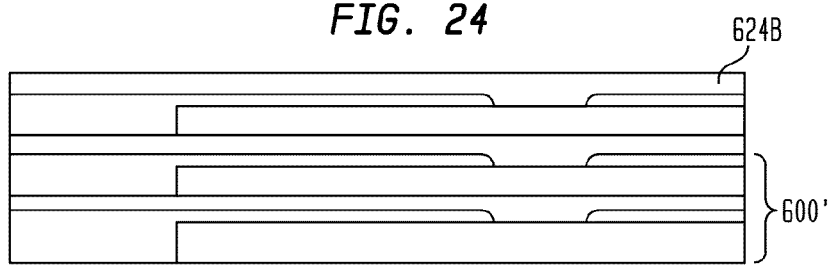

A third reconstituted wafer 630B, fabricated in accordance with the above-described process (FIGS. 17-19), is illustrated in FIG. 23, having carrier layer 660B attached. The third reconstituted wafer 630B can be aligned and joined to the second reconstituted wafer of the stacked assembly 600 in similar manner to that described above (FIG. 21). FIG. 24 illustrates the resulting stacked assembly 600', after the carrier layer 660B is removed and traces 624B are formed by the above-described process (FIG. 20).

Figure 25:
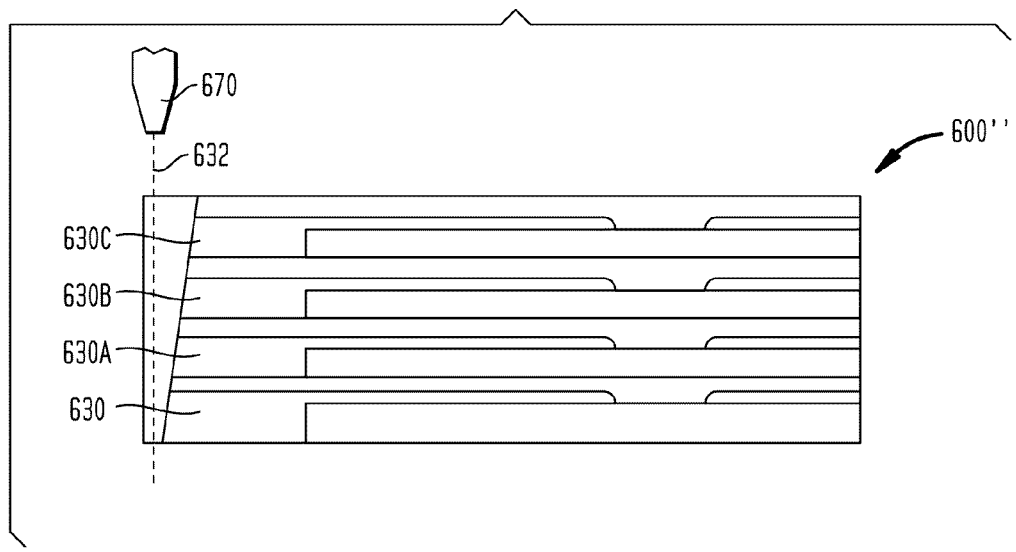

Additional layers of reconstituted wafers can be aligned and joined with the stacked assembly 600' by the above-described processing to form a stacked assembly having a greater number of layers. For example, FIG. 25 illustrates a stacked assembly 600" which includes four levels of reconstituted wafers 630, 630A, 630B and 630C therein. A cutting tool 670, e.g., a mechanical instrument or laser, is shown above a line 632 where a channel is to be formed in the stacked assembly 600". Channels having inclined or straight vertical walls typically are formed between confronting edges of adjacent microelectronic elements of each reconstituted wafer, as shown and described above with respect to FIGS. 6A-B. Channels can also be formed at edges of the stacked assembly where edges of microelectronic elements are adjacent only to one wall of the channel.

Figure 26:
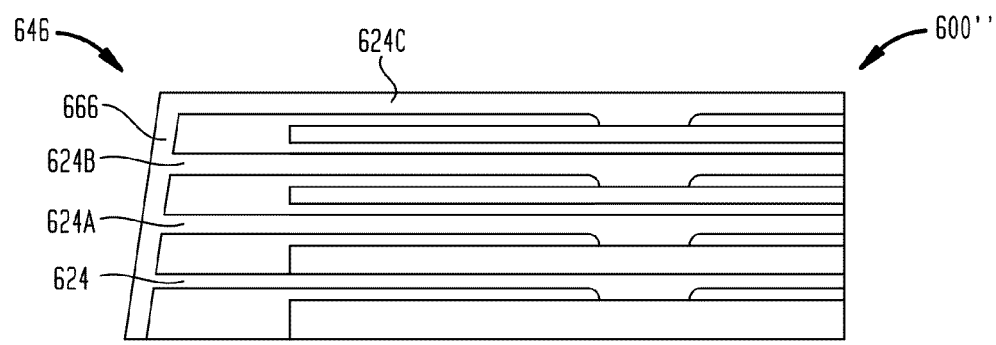

FIG. 26 illustrates the stacked assembly 600" after formation of a notch 646. Traces 624C and leads 666 connected to other traces 624, 624A, 624B of the stack can be formed either by separate processing or by a combined process, similar to that described above with reference to FIG. 7.

In variations of the embodiments illustrated in FIGS. 17 through 26, edges of the semiconductor die or microelectronic elements in the stacked assembly can be deliberately displaced from each other, as shown and described above with reference to FIGS. 9A-B, 10 or FIGS. 13-15. In a particular variation, traces of each semiconductor die or microelectronic element can be connected in a manner as described above with reference to FIG. 12. Alignment features can be fabricated on each die as illustrated and described above with respect to FIG. 16.

Features of the various embodiments described herein can be combined to form microelectronic units having some or all of the features of one described embodiment and one or more features of another described embodiment. Applicants intend by this disclosure to permit all such combination of features, even though such combinations may not be expressly described.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of fabricating a stacked microelectronic assembly, comprising:
   a) forming a first subassembly including a plurality of spaced apart first microelectronic elements, each first microelectronic element having a front face and contacts exposed at the front face, a rear face remote from the front face, first edges extending between the front and rear faces, a first dielectric layer overlying each of the respective first edges, and a plurality of traces extending from the contacts to beyond the first edges of the first microelectronic elements, the rear faces of the first microelectronic elements being joined to a carrier layer;
   b) attaching a plurality of spaced apart second microelectronic elements to the first subassembly, each second microelectronic element having a front face and contacts exposed at the front face, a rear face remote from the front face, second edges extending between the front and rear faces, such that the rear faces of the second microelectronic elements overlie and are adjacent to the front faces of respective ones of the first microelectronic elements, wherein a second dielectric layer overlies each of the respective second edges;
   c) after the attaching of the plurality of spaced apart second microelectronic elements to the first subassembly, forming a plurality of traces extending from the contacts of the second microelectronic elements to beyond the second edges of the second microelectronic elements; and
   d) forming leads in at least one opening extending between confronting first edges of adjacent ones of the first microelectronic elements and between confronting second edges of adjacent ones of the second microelectronic elements, each of the leads being connected to the traces of at least one of the first and at least one of the second microelectronic elements, and each of the leads formed on and extending along both the first and the second dielectric layers.

2. The method as claimed in claim 1, wherein each of the first and second microelectronic elements has a thickness of less than about 50 microns between the front face and the rear face.

3. The method as claimed in claim 1, wherein at least one of the microelectronic elements includes flash memory.

4. The method of making a stacked microelectronic unit including the method as claimed in claim 1, further comprising, after step (d), severing the stacked microelectronic assembly between the respective confronting first and confronting second edges of at least some of the respective adjacent ones of the first and second microelectronic elements into a plurality of stacked microelectronic units, each unit including at least one first microelectronic element and at least one second microelectronic element.

5. The method as claimed in claim 1, wherein the at least one opening includes channels extending between the respective confronting first and confronting second edges of at least some of the respective adjacent ones of the first and second microelectronic elements.

6. The method as claimed in claim 1, wherein the openings include a plurality of spaced apart openings aligned with edges of the first and second microelectronic elements and the leads extend within respective individual ones of the spaced apart openings, each lead being conductively connected with a single one of the traces.

7. The method as claimed in claim 1, wherein the opening extends a distance along the respective entire confronting first and entire confronting second edges of at least some of the respective adjacent ones of the first microelectronic elements and the confronting edges of the adjacent ones of the second microelectronic elements.

8. The method as claimed in claim 1, wherein the step of forming leads is performed after the attaching of the plurality of spaced apart second microelectronic elements to the first subassembly.

9. The method as claimed in claim 1, wherein at least one of the plurality of first microelectronic elements and the plurality second microelectronic elements form portions of a reconstituted wafer.

* * * * *